(12) United States Patent
Kimura et al.

(10) Patent No.: US 6,643,189 B2
(45) Date of Patent: *Nov. 4, 2003

(54) MEMORY DEVICE

(75) Inventors: Koichi Kimura, Yokohama (JP); Toshihiko Ogura, Ebina (JP); Hiroaki Aotsu, Yokohama (JP); Mitsuru Ikegami, Kanagawa-ken (JP); Tadashi Kuwabara, Yokohama (JP); Hiromichi Enomoto, Hadano (JP); Tadashi Kyoda, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/059,328

(22) Filed: Jan. 31, 2002

(65) Prior Publication Data

US 2002/0093852 A1 Jul. 18, 2002

Related U.S. Application Data

(63) Continuation of application No. 09/750,040, filed on Dec. 29, 2000, now Pat. No. 6,359,812, which is a continuation of application No. 09/428,925, filed on Oct. 28, 1999, now Pat. No. 6,198,665, which is a continuation of application No. 09/303,442, filed on May 3, 1999, now Pat. No. 6,028,795, which is a continuation of application No. 09/055,327, filed on Apr. 6, 1998, now Pat. No. 5,923,591, which is a continuation of application No. 08/853,713, filed on May 9, 1997, now Pat. No. 5,781,479, which is a continuation of application No. 08/694,599, filed on Aug. 9, 1996, now Pat. No. 5,719,809, which is a continuation of application No. 08/582,906, filed on Jan. 4, 1996, now Pat. No. 5,615,155, which is a continuation of application No. 08/435,959, filed on May 5, 1995, now Pat. No. 5,493,528, which is a continuation of application No. 08/294,407, filed on Aug. 23, 1994, now Pat. No. 5,448,519, which is a continuation of application No. 07/855,843, filed on Mar. 20, 1992, now Pat. No. 5,450,342, which is a continuation-in-part of application No. 07/349,403, filed on May 8, 1989, now Pat. No. 5,175,838, which is a continuation of application No. 07/240,380, filed on Aug. 29, 1988, now Pat. No. 4,868,781, which is a continuation of application No. 06/779,676, filed on Sep. 24, 1985, now abandoned.

(30) Foreign Application Priority Data

| Oct. 5, 1984 | (JP) | ............................................ 59-208266 |
| May 20, 1985 | (JP) | ............................................ 60-105844 |
| May 20, 1985 | (JP) | ............................................ 60-105845 |
| May 20, 1985 | (JP) | ............................................ 60-105847 |
| May 20, 1985 | (JP) | ............................................ 60-105850 |

(51) Int. Cl.$^7$ ............................................ G11C 13/00
(52) U.S. Cl. ........................ 365/189.04; 365/189.03
(58) Field of Search ........................ 365/189.01, 189.03, 365/189.04, 230.01, 230.03

(56) References Cited

U.S. PATENT DOCUMENTS

| 3,546,680 A | 12/1970 | Bahrs et al. |
| 3,665,419 A | 5/1972 | Hartmann et al. ..... 364/DIG. 1 |

(List continued on next page.)

FOREIGN PATENT DOCUMENTS

| DE | 3437896 | 4/1985 |
| GB | 2103339 | 2/1983 |

(List continued on next page.)

OTHER PUBLICATIONS

E. Mumprecht, "Efficient Bit String Handling with Standard Processing Units", IBM Technical Disclosure Bulletin, Mar. 1984, vol. 26, No. 10A, pp. 4912–4914.

(List continued on next page.)

*Primary Examiner*—Vu A. Le
(74) *Attorney, Agent, or Firm*—Antonelli, Terry, Stout & Kraus, LLP

(57) ABSTRACT

A memory device which includes dynamic random access memories for effecting data read and write operations, first and second data terminals for receiving data, and a controller having a first data input connected to receive first data, a second data input connected to receive second data, a third data input connected to receive a function mode signal, and operation unit for executing operations between the first data and the second data. The operation unit includes a function setting unit for setting a function indicated by a function mode signal prior to receipt of the first data. The second data is read out of a selected part of the storage locations. The operation corresponding to the set function is executed for the first and second data. The operation result is written into the selected part of the storage locations during one memory cycle.

4 Claims, 31 Drawing Sheets

U.S. PATENT DOCUMENTS

| | | | |
|---|---|---|---|
| 3,737,866 A | 6/1973 | Gruner | 365/189.01 |
| 3,787,817 A | 1/1974 | Goldberg | 395/425 |
| 3,976,982 A | 8/1976 | Eiselen | 364/200 |
| 3,984,670 A | 10/1976 | Erickson et al. | 364/200 |
| 4,080,651 A | 3/1978 | Cronshaw et al. | |
| 4,093,993 A | 6/1978 | Sato | 395/800 |
| 4,095,268 A | 6/1978 | Kobayashi et al. | |
| 4,099,231 A | 7/1978 | Kotok et al. | |
| 4,164,787 A | 8/1979 | Aranguren | |
| 4,231,085 A | 10/1980 | Bazlen et al. | 364/200 |
| 4,237,543 A | 12/1980 | Nishio et al. | 364/900 |
| 4,302,809 A | 11/1981 | Drogichen | |
| 4,317,114 A | 2/1982 | Walker | 340/721 |
| 4,435,792 A | 3/1984 | Bechtolsheim | 358/166 X |
| 4,438,493 A | 3/1984 | Cushing et al. | |
| 4,439,829 A | 3/1984 | Tsiang | |
| 4,450,442 A | 5/1984 | Tanaka | 340/814 |
| 4,467,443 A | 8/1984 | Shima | 364/900 |
| 4,484,187 A | 11/1984 | Brown et al. | 340/703 |
| 4,531,120 A | 7/1985 | Brownell, Jr. et al. | 340/723 |
| 4,545,068 A | 10/1985 | Tabata et al. | |
| 4,550,315 A | 10/1985 | Bass et al. | 340/703 |
| 4,559,533 A | 12/1985 | Bass et al. | 340/724 |
| 4,561,072 A | 12/1985 | Arakawa et al. | |
| 4,570,222 A | 2/1986 | Oguchi | 365/244 |
| 4,578,773 A | 3/1986 | Desai et al. | |
| 4,613,852 A | 9/1986 | Marubo | 340/723 |
| 4,616,336 A | 10/1986 | Robertson et al. | 364/900 |
| 4,639,768 A | 1/1987 | Ueno et al. | 358/22 |
| 4,641,282 A | 2/1987 | Ohnuma | 340/703 |
| 4,653,020 A | 3/1987 | Cheselka et al. | 364/900 |
| 4,660,181 A | 4/1987 | Saito et al. | |
| 4,672,534 A | 6/1987 | Kamiya | 364/200 |
| 4,685,089 A | 8/1987 | Patel et al. | 365/233 |
| 4,719,601 A | 1/1988 | Gray et al. | 365/210 |
| 4,729,119 A | 3/1988 | Dennison et al. | 365/63 X |
| 4,742,474 A | 5/1988 | Knierim | 365/230.03 |
| 4,868,781 A | 9/1989 | Kimura et al. | 395/425 |
| 4,903,236 A | 2/1990 | Nakayama et al. | 365/218 |
| 5,089,993 A | 2/1992 | Neal et al. | 365/63 |
| 5,134,589 A | 7/1992 | Hamano | 365/218 |
| 5,175,838 A | 12/1992 | Kimura et al. | 365/189.01 |
| 5,193,073 A | 3/1993 | Bhova | 365/226 |
| 5,339,275 A | 8/1994 | Hyatt | 365/189.01 |
| 5,396,468 A | 3/1995 | Harari et al. | 365/189.01 |
| 5,424,981 A | 6/1995 | Kimura et al. | 365/189.01 |
| 5,523,973 A | 6/1996 | Kimura et al. | 365/189.01 |
| 5,923,591 A | 7/1999 | Kimura et al. | 365/189.01 |

FOREIGN PATENT DOCUMENTS

| | | |
|---|---|---|
| JP | 504529 | 2/1975 |
| JP | 54124187 | 9/1979 |
| JP | 54142938 | 11/1979 |
| JP | 57112788 | 7/1982 |
| JP | 5960658 | 9/1982 |
| JP | 58115673 | 7/1983 |
| JP | 58178470 | 10/1983 |
| JP | 58189690 | 11/1983 |
| JP | 58196671 | 11/1983 |
| JP | 0208845 | 12/1983 |
| JP | 5995669 | 6/1984 |
| JP | 0005339 | 1/1986 |
| JP | 61264378 | 11/1986 |
| JP | 61264379 | 11/1986 |

OTHER PUBLICATIONS

N.A. Alexandridis, "Microprocessor System Design Concepts", Computer Science Press, 1984, pp. 1–12, 29–34.

"A Local Network Based on the UNIX Operating System", IEEE Transactions on Software Engineering, Mar. 1982, vol. 528, No. 2, pp. 137–146.

| WRITE MODE | X | Y | Z |
|---|---|---|---|
| MODE I | 0 | — | Y |
| MODE II | 1 | 0 | Do |
| | | 1 | $\overline{Do}$ |

| X | Y | Do | Z | WRITE MODE |
|---|---|----|---|------------|
| 0 | 0 | —  | 0 | MODE I |
| 0 | 0 | —  | 0 | |
| 0 | 1 | —  | 1 | |
| 0 | 1 | —  | 1 | |
| 1 | 0 | 0  | 0 | MODE II |
| 1 | 0 | 1  | 1 | |
| 1 | 1 | 0  | 1 | |
| 1 | 1 | 1  | 0 | |

FIG. 9

| S0 | S1 | S2 | S3 | X | Y | Z | FUNCTION | REMARKS |
|----|----|----|----|---|---|---|----------|---------|
| 0 | 0 | 0 | 0 | 0 | 0 | 0 | Zero | |
| 0 | 0 | 0 | 1 | 0 | 1 | 1 | One | |
| 0 | 0 | 1 | 0 | 0 | $D_i$ | $D_i$ | Pass | |
| 0 | 0 | 1 | 1 | 0 | $\overline{D_i}$ | $\overline{D_i}$ | NOT | |
| 0 | 1 | 0 | 0 | 1 | 0 | $D_o$ | Keep | |
| 0 | 1 | 0 | 1 | 1 | 1 | $\overline{D_o}$ | NOT | |
| 0 | 1 | 1 | 0 | 1 | $D_i$ | $D_i \oplus D_o$ | EOR | |
| 0 | 1 | 1 | 1 | 1 | $\overline{D_i}$ | $\overline{D_i \oplus D_o}$ | ENOR | |
| 1 | 0 | 0 | 0 | $D_i$ | 0 | $D_i \cdot D_o$ | AND | CASE 2 |
| 1 | 0 | 0 | 1 | $D_i$ | 1 | $D_i + \overline{D_o}$ | OR | |
| 1 | 0 | 1 | 0 | $D_i$ | $D_i$ | $D_i \cdot D_o$ | AND | |
| 1 | 0 | 1 | 1 | $D_i$ | $\overline{D_i}$ | $\overline{D_i} + D_o$ | OR | |
| 1 | 1 | 0 | 0 | $\overline{D_i}$ | 0 | $\overline{D_i} \cdot D_o$ | AND | |
| 1 | 1 | 0 | 1 | $\overline{D_i}$ | 1 | $D_i + D_o$ | OR | CASE 1 |
| 1 | 1 | 1 | 0 | $\overline{D_i}$ | $D_i$ | $D_i + \overline{D_o}$ | OR | |
| 1 | 1 | 1 | 1 | $\overline{D_i}$ | $\overline{D_i}$ | $\overline{D_i} \cdot D_o$ | AND | |

SELECTION OF X: S0, S1
SELECTION OF Y: S2, S3

| P | Di'(A) | (B) | S4 | Di |
|---|---|---|---|---|
| 0 | 0 | 0 | 1 | M1 (BACKGROUND) |
|   | 0 | 1 | 1 | M1 |
|   | 1 | 0 | 0 | M2 |
|   | 1 | 1 | 0 | M2 |
| 1 | 0 | 0 | 1 | M1 (BACKGROUND) |
|   | 0 | 1 | 1 | M1 |
|   | 1 | 0 | 0 | M2 |
|   | 1 | 1 | 1 | M1 |

FIG. 20

| CNT | Cr | Y | Z |
|-----|----|----|---|
| 0 | 0 | 0 | Do |
| 0 | 0 | 1 | $\overline{Do}$ |
| 0 | 1 | — | Y |
| 1 | — | — | Y PLUS Do PLUS Cr |

$$Z = \overline{(\overline{CNT} \cdot Cr)} \cdot Y + \overline{(\overline{CNT} \cdot Cr)} \cdot (Y \oplus Do \oplus Cr)$$

$$\overline{P} = \overline{Y \oplus Do + CNT}$$

$$\overline{G} = \overline{Y \cdot Do \cdot CNT}$$

FIG. 23b

| S₀ | S₁ | S₂ | S₃ | Z | |
|---|---|---|---|---|---|
| | | | | CNT = 0 | CNT = 1 |
| 0 | 0 | 0 | 0 | Do | Do |
| 0 | 0 | 1 | 0 | $\overline{Do}$ | Do MINUS 1 |
| 0 | 0 | 0 | 1 | Di ⊕ Do | DiPLUS Do |
| 0 | 0 | 1 | 1 | Di ⊕ Do | DoMINUS DiMINUS 1 |
| 1 | 0 | 0 | 0 | 0 | Do PLUS 1 |
| 1 | 0 | 1 | 0 | 1 | Do |
| 1 | 0 | 0 | 1 | Di | DiPLUS DoPLUS 1 |
| 1 | 0 | 1 | 1 | $\overline{Di}$ | Do MINUS Di |
| 0 | 1 | 0 | 0 | $\overline{Di}$ − Do | Do |
| 0 | 1 | 1 | 0 | Di + $\overline{Do}$ | Do MINUS 1 |
| 0 | 1 | 0 | 1 | Di + Do | DiPLUS Do |
| 0 | 1 | 1 | 1 | $\overline{Di \cdot Do}$ | DoMINUS DiMINUS 1 |
| 1 | 1 | 0 | 0 | Di · Do | Do PLUS 1 |
| 1 | 1 | 1 | 0 | $\overline{Di + Do}$ | Do |
| 1 | 1 | 0 | 1 | Di · $\overline{Do}$ | DiPLUS DoPLUS 1 |
| 1 | 1 | 1 | 1 | $\overline{Di} + Do$ | Do minus Di |

F I G. 26
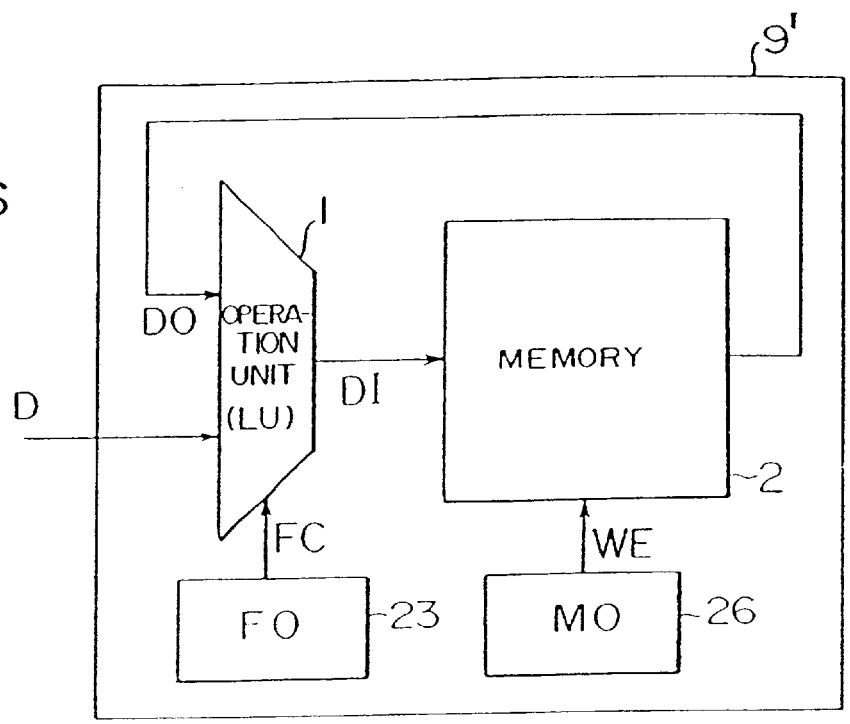
F I G. 27
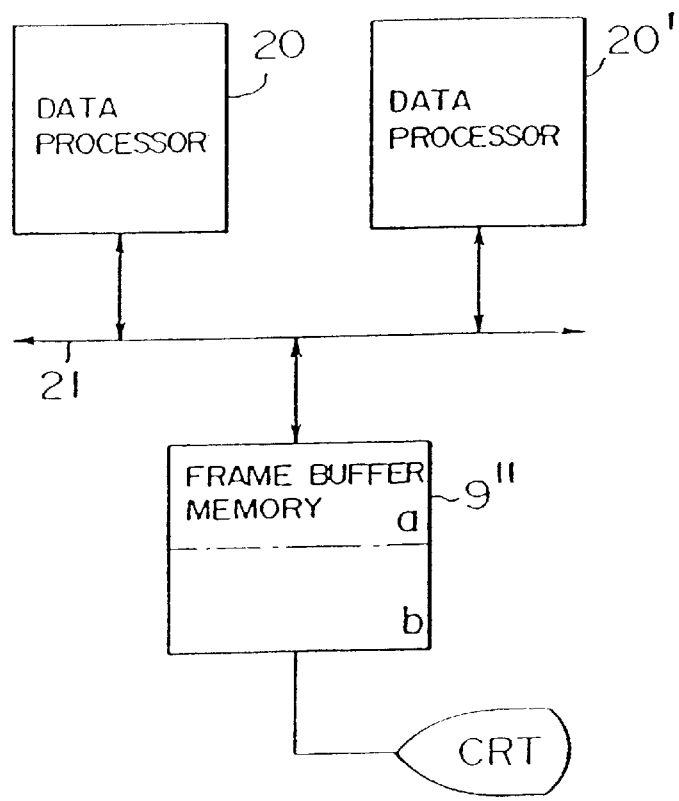

FIG. 31

| FC3 | FC2 | FC1 | FC0 | DI |
|---|---|---|---|---|
| 0 | 0 | 0 | 0 | DO |
| 0 | 0 | 0 | 1 | $\overline{DO}$ |
| 0 | 0 | 1 | 0 | $D \oplus DO$ |
| 0 | 0 | 1 | 1 | $\overline{D \oplus DO}$ |
| 0 | 1 | 0 | 0 | 0 |
| 0 | 1 | 0 | 1 | 1 |
| 0 | 1 | 1 | 0 | D |
| 0 | 1 | 1 | 1 | $\overline{D}$ |
| 1 | 0 | 0 | 0 | $\overline{D} \cdot DO$ |
| 1 | 0 | 0 | 1 | $D + \overline{DO}$ |
| 1 | 0 | 1 | 0 | $D + DO$ |
| 1 | 0 | 1 | 1 | $\overline{D} \cdot \overline{DO}$ |
| 1 | 1 | 0 | 0 | $D \cdot DO$ |
| 1 | 1 | 0 | 1 | $\overline{D} + \overline{DO}$ |
| 1 | 1 | 1 | 0 | $D \cdot \overline{DO}$ |
| 1 | 1 | 1 | 1 | $\overline{D} + DO$ |

MEMORY DEVICE

CROSS REFERENCE TO RELATED APPLICATIONS

The present application is a continuation of application Ser. No. 09/750,040, filed Dec. 29, 2000; now U.S. Pat. No. 6,359,812 which is a continuation of application Ser. No. 09/428,925, filed Oct. 28, 1999, now U.S. Pat. No. 6,198,665; which is a continuation of application Ser. No. 09/303,442, filed May 3, 1999, now U.S. Pat. No. 6,028,795; which is a continuation of Ser. No. 09/055,327, filed Apr. 6, 1998, now U.S. Pat. No. 5,923,591; which is a continuation of Ser. No. 08/853,713, filed May 9, 1997, now U.S. Pat. No. 5,781,479; which is a continuation of application Ser. No. 08/694,599, filed Aug. 9, 1996, now U.S. Pat. No. 5,719,809; which is a continuation of application Ser. No. 08/582,906, filed Jan. 4, 1996, now U.S. Pat. No. 5,615,155; which is a continuation of application Ser. No. 08/435,959, filed May 5, 1995, now U.S. Pat. No. 5,493,528; which is a continuation of application Ser. No. 08/294,407, filed Aug. 23, 1994, now U.S. Pat. No. 5,448,519; which is a continuation of application Ser. No. 07/855,843, filed Mar. 20, 1992, now U.S. Pat. No. 5,450,342; which is a continuation-in-part of application Ser. No. 07/349,403, filed May 8, 1989, now U.S. Pat. No. 5,175,838; which is a continuation of application Ser. No. 07/240,380, filed Aug. 29, 1988, now U.S. Pat. No. 4,868,781; which is a continuation of application Ser. No. 06/779,676, filed Sep. 24, 1985, now abandoned; said U.S. Pat. No. 4,868,781 being reissued by application Ser. No. 07/542,028, filed Jun. 21, 1990 now Pat. No. Re. 33,922; said application Ser. No. 07/855,843, filed Mar. 20, 1992, now U.S. Pat. No. 5,450,342 also being a continuation-in-part of Ser. No. 07/816,583, filed Jan. 3, 1992, now abandoned; which is a continuation of application Ser. No. 07/314,238, filed Feb. 22, 1989 now U.S. Pat. No. 5,113,487; which is a continuation of application Ser. No. 06/864,502, filed May 19, 1986, now abandoned, said application Ser. No. 07/816,583, filed Jan. 3, 1992, now abandoned, also being a continuation-in-part of application Ser. No. 07/349,403, filed May 8, 1989 now U.S. Pat. No. 5,175,383; which is a continuation of application Ser. No. 06/779,676, filed Sep. 24, 1985, now abandoned.

BACKGROUND OF THE INVENTION

The present invention relates to a memory device, and in particular, to a memory device suitable for a graphic memory to be utilized in high-speed image processing.

The prior art technique will be described by referring to graphic processing depicted as an example in FIGS. 1–2. For example, the system of FIG. 1 comprises a graphic area M1 having a one-to-one correspondence with a cathode ray tube (CRT) screen, a store area M2 storing graphic data to be combined, and a modify section FC for combining the data in the graphic area M1 with the data in the store area M2. in FIG. 2, a processing flowchart includes a processing step S1 for reading data from the graphic area M1, a processing step S2 for reading data from the store area M2, a processing step S3 for combining the data read from the graphic area M1 and the data read from the store area M2, and a processing step S4 for writing the composite data generated in the step S3 in the graphic area M1.

In the graphic processing example, the processing step S3 of FIG. 2 performs a logical OR operation only to combine the data of the graphic area M1 with that of the store area M2.

On the other hand, the graphic area M1 to be subjected to the graphic processing must have a large memory capacity ranging from 100 kilobytes to several megabytes in ordinary cases. Consequently, in a series of graphic processing steps as shown in FIG. 2, the number of processing iterations to be executed is on the order of $10^6$ or greater even if the processing is conducted on each byte one at a time.

Similarly referring to FIGS. 2–3, graphic processing will be described in which the areas M1 and M2 store multivalued data such as color data for which a pixel is represented by the use of a plurality of bits.

Referring now to FIG. 3, a graphic processing arrangement comprises a memory area M1 for storing original multivalued graphic data and a memory area M2 containing multivalued graphic data to be combined therewith.

For the processing of multivalued graphic data shown in FIG. 3, addition is adopted as the operation to ordinarily generate composite graphic data. As a result, the values of data in the overlapped portion become larger, and hence a thicker picture is displayed as indicated by the crosshatching. in this case, the memory area must have a large memory capacity. The number of iterations of processing from the step S1 to the step S4 becomes on the order of $10^6$ or greater, as depicted in FIG. 2. Due to the large iteration count, most of the graphic data processing time is occupied by the processing time to be elapsed to process the loop of FIG. 2. In graphic data processing, therefore, the period of time utilized for the memory access becomes greater than the time elapsed for the data processing. Among the steps S1–S4 of FIG. 2, three steps S1, S2, and S4 are associated with the memory access. As described above, in such processing as graphic data processing in which memory having a large capacity is accessed, even if the operation speed is improved, the memory access time becomes a bottleneck of the processing, which restricts the processing speed and does not permit improving the effective processing speed of the graphic data processing system.

In the prior art examples, the following disadvantages take place.
(1) In the graphic processing as shown by-use of the flowchart of FIG. 2, most of the processing is occupied by the steps S1, S2, and S4 which use a bus for memory read/write operations consequently, the bus utilization ratio is increased and a higher load is imposed on the bus.
(2) The graphic processing time is further increased, for example, because the bus has a low transfer speed, or the overhead becomes greater due to the operation such as the bus control to dedicatedly allocate the bus to CRT display operation and to memory access.
(3) Moreover, although the flowchart of FIG. 2 includes only four static processing steps, a quite large volume of data must be processed as described before. That is, the number of dynamic processing steps which may elapse the effective processing time becomes very large, and hence a considerably long processing time is necessary.

Consequently, it is desirable to implement a graphic processing by use of a lower number of processing steps.

A memory circuit for executing the processing described above is found in the Japanese Patent Unexamined Publication No. 55-129387, for example.

Recent enhanced resolution of graphic display units is now demanding a large-capacity memory for use as a frame buffer for holding display information. In displaying a frame of graphic data, a large number of access operations to a capacious frame buffer take place, and therefore high-speed memory read/write operations are required. A conventional method for coping with this requirement is the distribution of processings.

An example of the distributed process is to carry out part of the process with a frame buffer. FIG. 26 shows, as an example, the arrangement of the frame buffer memory circuit, used in the method. The circuit includes an operation unit 1, a memory 2, an operational function control register 23, and a write mask register 26. The frame buffer writes data in bit units regardless of the word length of the memory device. On this account, the frame buffer writing process necessitates to implement operation and writing both in bit units. In the example of FIG. 26, bit operation is implemented by the operation unit I and operational function control register 23, while bit writing is implemented by the mask register 6 only to bits effective for writing. This frame buffer is designed to implement the memory read-modify-write operation in the write cycle for data D from the data processor, eliminating the need for the reading of data DO out of the memory, which the usual memory necessitates in such operation, whereby speedup of the frame buffer operation is made possible.

FIG. 27 shows another example of distributed processing which is applied to a graphic display system consisting of two data processors 20 and 20', linked through a common bus 21 with a frame buffer memory 9". The frame buffer memory 9" is divided into two areas a and b which are operated for display by the data processors 20 and 20', respectively. FIG. 28 shows an example of a display made by this graphic system. The content of the frame buffer memory 9" is displayed on the CRT screen, which is divided into upper and lower sections in correspondence with the divided memory areas a and b as shown in FIG. 28. When it is intended to set up the memory 9" for displaying a circle, for example, the data processor 20 produces an arc aa'a" and the data processor 20', produces a remaining arc bb'b" concurrently. The circular display process falls into two major processings of calculating the coordinates of the circle and writing the result into the frame buffer. In case the calculation process takes a longer time than the writing process, the use of the two processors 20 and 201 for the process is effective for the speedup of display. If, on the other hand, the writing process takes a longer time, the two processors conflict over the access to the frame buffer memory 9", resulting in a limited effectiveness of the dual processor system. The recent advanced LSI technology has significantly reduced the computation time of data processors relative to the memory write access time, which fosters the use of a frame buffer memory requiring less access operations such as one 9' shown in FIG. 26.

In application of the frame buffer memory 9' shown in FIG. 26 to the display system shown in FIG. 27, when both processors share in the same display process as shown in FIG. 28, the memory modification function is consistent for both processors and no problem will arise. In another case, however, if one processor draws graphic display a' and another processor draws character display b' as shown in FIG. 29, the system is no longer uneventful. In general, different kinds of display are accompanied by different memory modification operations, and if two processors make access to the frame buffer memory alternately, the setting for the modification operation and the read-modify-write operation need to take place in each display process. Setting for modification operation is identical to memory access when seen from the processor, and such double memory access ruins the attempt of speedup.

A conceivable scheme for reducing the number of computational settings is the memory access control in which one processor makes access to the frame buffer several times and then hands over the access right to another processor, instead of the alternate memory access control. However, this method requires additional time for the process of handing over the access right between the processors as compared with the display process using a common memory modification function. Namely, the conventional scheme of sharing in the same process among more than one data processor as shown in FIG. 28 is recently shifting to the implementation of separate processes as shown in FIG. 29 with a plurality of data processors as represented by the multi-window system, and the memory circuit is not designed in consideration of this regard.

An example of the frame buffer using the read-modify-write operation is disclosed, for example, in an article entitled "Designing a 1280-by-1024 pixel graphic display frame buffer in a 64K RAM with nibble mode", Nikkei electronics, pp. 227–245, published on Aug. 27, 1984.

SUMMARY OF THE INVENTION

It is therefore an object of the present invention to-provide a method for storing graphic data and a circuit using the method which enables a higher-speed execution of dyadic and arithmetic operations on graphic data.

Another object of the present invention is to provide a memory circuit which performs read, modify, and write operations in a write cycle so that the number of dynamic steps is greatly reduced in the software section of the graphic processing.

Still another object of the present invention is to provide a memory circuit comprising a function to perform the dyadic and arithmetic operations so as to considerably lower the load imposed on the bus.

Further another object of the present invention is to provide a memory circuit which enables easily to implement a priority processing to be effected when graphic images are overlapped.

Further another object of the present invention is to provide a memory circuit with logical functions for use in constructing a frame buffer suitable for the multiple processors, parallel operations with the intention of realizing a high-speed graphic display system.

According to the present invention, there is provided a memory circuit having the following three functions to effect a higher-speed execution of processing to generate composite graphic data.

(1) A function to write external data in memory elements.
(2) A function to execute a logical operation between data previously stored in memory elements and external data, and to write the resultant data in the memory elements.
(3) A function to execute an arithmetic operation between data previously stored in memory elements and external data and to write the resultant data, in the memory elements.

A memory circuit which has these functions and which achieves a portion of the operation has been, implemented with emphasis placed on the previous points.

Also, many operations other than processing to generate composite multivalued graphic data as described above, a dyadic logic operation is required in which two operands are used. That is, the operation format is as follows in such cases.

D—D op s; where op stands for operator. On the other hand, the polynomial operation and multioperand operation as shown below are less frequently used.

$$D-S_1 op S_2 op \ldots op S_n$$

when the dyadic and two-operand operation is conducted between data in a central processing unit (CPU) an data in the memory elements, memory elements need be accessed only once if the operation result is to be stored in a register of the CPU (in a case where the D is a register and the S is a unit of memory elements) Contrarily, if the D indicates the memory elements unit and the S represents a register, the memory elements unit must be accessed two times. In most cases of data Processing including the multivalued graphic data processing, the number of data items is greater than the number of registers in the CPU; and hence the operation of the latter case where the D is the data element unit is frequently used; furthermore, each of two operands is stored in a memory element unit in many cases. Although the operation to access the S is indispensable to read the data, the D is accessed twice for read and write operations, that is, the same memory element unit is accessed two times for an operation.

To avoid this disadvantageous feature, the Read-Modify-Write adopted in the operation to access a dynamic random access memory (DRAM) is utilized so as to provide the memory circuit with an operation circuit so that the read and logic operations are carried out in the memory circuit, whereby the same memory element unit is accessed only once for an operation. The graphic data is modified in this fashion, which unnecessitates the operation to read the graphic data to be stored in the CPU and reduces the load imposed on the bus.

In accordance with the present invention there is provided a unit of memory elements which enables arbitrary operations to read, write, and store data characterized by including a control circuit which can operate in an ordinary write mode for storing in the memory elements unit a first data supplied externally based on first data and second data in the memory elements unit, a logic operation mode for storing an operation result obtained from a logic operation executed between the first and second data, and an arithmetic operation mode for storing in the memory element unit result data obtained from an arithmetic operation executed between the first data and the second data.

In general, when it is intended to share a resource by a plurality of processors, the resource access arbitration control is necessary, and when it is intended for a plurality of processors to share in a process for the purpose of speedup, they are required to operate and use resources in unison. These controls are generally implemented by the program of each processor, and it takes some processing time. Resources used commonly among processors include peripheral units and a storage unit. A peripheral unit is used exclusively for a time period once a processor has begun its use, while the storage unit is accessed by processors on a priority basis. The reason for the different utilization modes of the resources is that a peripheral unit has internal sequential operating modes and it is difficult for the unit to suspend the process in an intermediate mode once the operation has commenced, while the storage unit completes the data read or write operation within the duration of access by a processor and its internal operational mode does not last after the access terminates.

When it is intended to categorize the aforementioned memory implementing the read-modify-write operation in the above resource classification, the memory is a peripheral unit having the internal modification function, but the internal operating mode does not last beyond the access period, and operates faster than the processor. Accordingly, the memory access arbitration control by the program of the low-speed processor results in an increased system overhead for the switching operation, and therefore such control must be done within the memory circuit. The memory circuit implementing the read-modify-write operation does not necessitate internal operating modes dictated externally and it can switch the internal states to meet any processor solely by the memory internal operation.

The present invention resides in a memory circuit including a memory device operative to read, write and hold data, an operator which performs computation between first data supplied from outside and second data read out of the memory device, means for specifying an operational function from outside, and means for controlling bit writing from outside, wherein the operational function specifying means issues a selection control signal to a selector which selects one of a plurality of operational function specifying data supplied from outside, and wherein the bit writing control means issues a selection control signal to a selector which selects one of a plurality of bit writing control data supplied from outside, so that a frame buffer memory which implements the read-modify-write operation can be used commonly.

BRIEF DESCRIPTION OF THE DRAWINGS

FIG. 7 is schematic circuit diagram for implementing the logic function.

FIGS. 8–9 are tables for explaining truth values in detail.

FIG. 20 is a table for explaining the operation modes of a control circuit.

FIGS. 23a to 23c are-diagrams for explaining an application example of an embodiment.

FIG. 26 is a block diagram showing the conventional memory circuit;

FIG. 27 is a block diagram showing the conventional graphic display system;

FIG. 31 is a table used to explain the operational function of the embodiment shown in FIG. 30;

DESCRIPTION OF THE PREFERRED EMBODIMENTS

Referring to the accompanying drawings, the following paragraphs describe embodiments of the present invention in detail.

Figure 4:
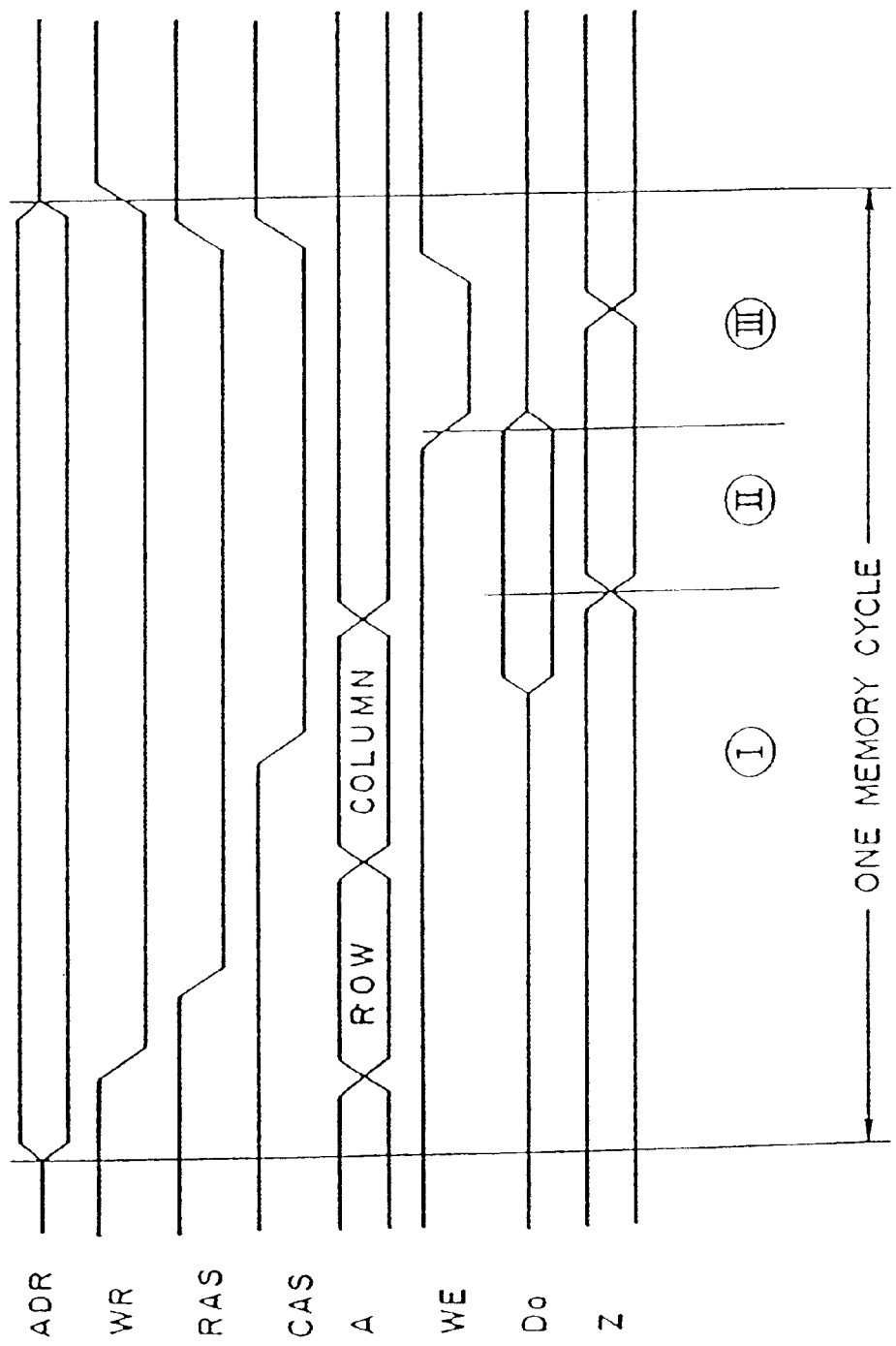
FIG. 4 is a timing chart illustrating the ordinary operation of a memory.

FIG. 4 is a timing chart of a DRAM. First, the operation to access the memory will be briefly described in conjunction with FIG. 4. In this timing chart, ADR is an address signal supplied from an external device and WR indicates a write request signal. These two signals (ADR and WR) are fed from a microprocessor, for example. In addition, RAS is a row address strobe signal, CAS is a column address strobe signal, A indicates an address signal representing a column or row address generated in the timesharing fashion, WE stands for a write enable signal, and Z is a data item supplied from an external device (microprocessor). Excepting the Z signal, they are control signals generated by a DRAM controller, for example. The memory access outlined in FIG. 4 can be summarized as follows.

(i) As shown in FIG. 4, a memory access in a read/write cycle generally commences with a read cycle (I) and ends with a write cycle (III) due to a write enable signal, WE.

(ii) Between the read cycle (I) and the write cycle (III), there appears an interval (II) in which a read data Do and an external data Z (to be written) exist-simultaneously.

(iii) This interval (ii) is referred to as the operation enabled interval.

As described above, the store data Do and the external write data Z exist simultaneously in the interval (II). As a consequence, the store data Do and the external data Z can be subjected to an operation during a memory cycle in this interval by use of the memory circuit having an operation function, thereby enabling the operation result to be written in the memory circuit.

Figures 5, 6:
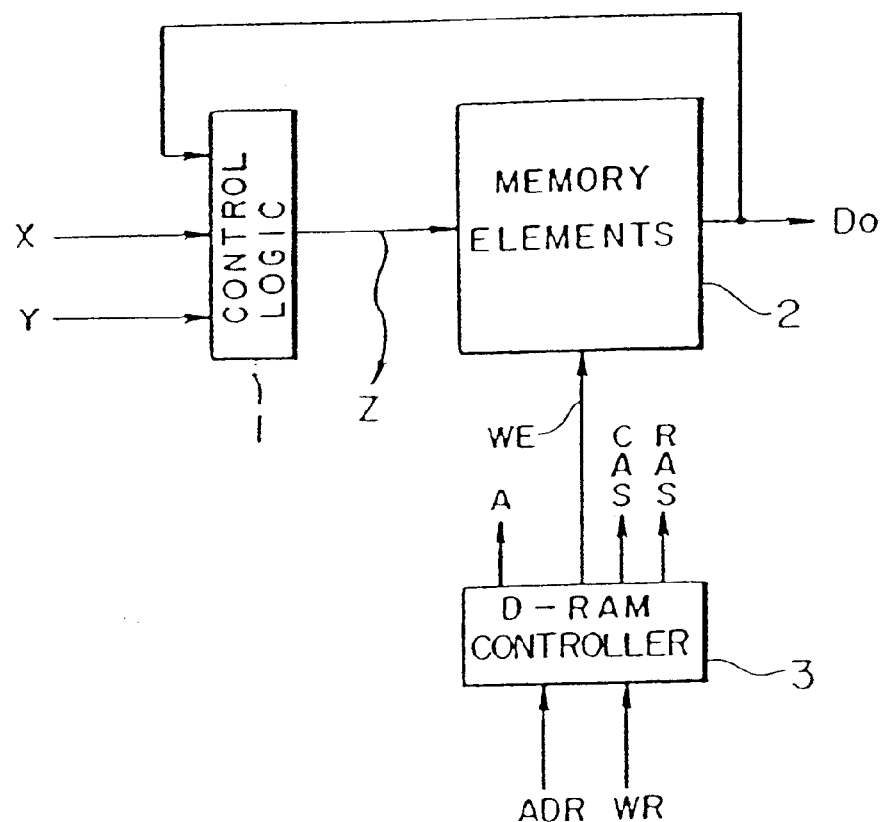
FIG. 5 is an explanatory diagram of a memory having a logic function.
FIG. 6 is a table for explaining the operation modes of the memory of FIG. 5.
Figures 7, 8:
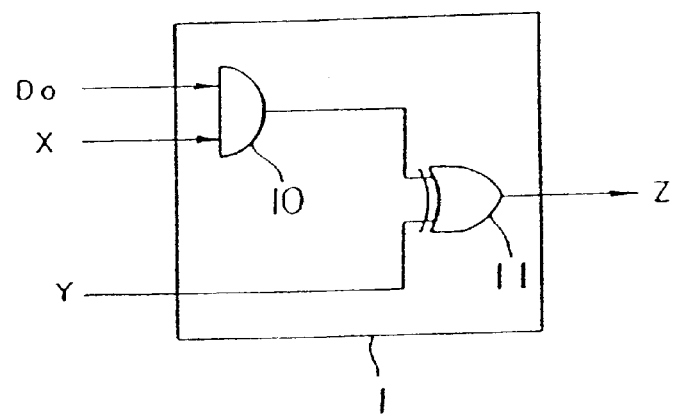

FIG. 5 is a block diagram illustrating a first embodiment of the present invention, FIG. 6 is an explanatory diagram of the operation principle of the embodiment shown in FIG. 5, FIG. 7 is a circuit example implementing the operation principle of FIG. 6, and FIG. 8 is a table for explaining in detail the operation of the circuit shown in FIG. 7.

The circuit configuration of FIG. 5 comprises a control logic circuit 1, a unit of memory elements 2, a DRAM controller 3, external data X and Y, a write data Z to the memory elements unit 2, a read data Do from the memory elements unit 2, and signals A, CAS, RAST ADR, and WR which are the same as those described in conjunction with FIG. 4. The external data Z of FIG. 4 is replaced with the write data Z delivered via the control circuit to the memory elements unit 2 in FIG. 5.

In accordance with an aspect of the present invention as shown in FIG. 5, the control circuit I controls the read data Do by use of the external data signals X and Y, and the modified read data is written in the memory elements unit 2. FIG. 6 is a table for explaining the control operation. In this table, mode I is provided to set the external data Y as the write data Z, whereas mode II is provided to set the read data Do as the write data Z. As shown in FIG. 6, the external data signals X and Y, namely, the external control is used to control two modes, that is, the read data of the memory elements unit 2 is altered and written (mode II), or the external data Y is written (mode I). For the control of two modes, (i) mode I or II is specified by the external data X and (ii) the modification specification to invert or not to invert the read data Do is made by use of an external data.

The control and modification are effected in the interval (II) described in conjunction with FIG. 4.

A specific circuit example implementing the operation described above is shown in FIG. 7.

The control logic circuit comprises an AND gate 10 and an EOR gate 11 and operates according to the truth table of FIG. 8, which illustrates the relationships among two external data signals X and Y, store data Do, -and output Z from the control circuit 1.

As can be seen from FIG. 8, the control circuit 1 operates primarily in the following two operation modes depending on the external data X.

(i) When the external data X is '0', it operates in the operation mode I in which the external data Y is processed as the write data Z.

(ii) When the external data X is '1', it operates in the operation mode II in which the data obtained by modifying the read data Do based on the external data Y is used as the write data Z.

As already shown in FIG. 4, the operation above is executed during a memory cycle.

Consequently, the principle of the present invention is described as follows.

(i) The output Do from the memory elements unit 2 is fed back as an input signal to the control circuit as described in conjunction with FIG. 4; and (ii) The write data to, the memory elements unit 2 is controlled by use of the input data signals X and Y (generated from the write data from the CPU) as shown in FIG. 5.

These operations (i) and (ii) are executed during a, memory cycle. That is, a data item in the memory elements is modified with an external input data (namely, an operation is conducted between these two data items) during a memory cycle by use of three data items including (i) feedback data from the memory elements, (ii) data inputted from an external device, and (iii) control data from an external device (a portion of external input data is also used as the control data). These operations imply that an external device (for example, a graphic processing system, a CPU available at present, or the like) can execute a logic operation only by use of a write operation.

The operation of the circuit shown in FIG. 7, on the other hand, is expressed as follows $$Z = X \cdot Do\ Y + X \cdot Do\ Y = Do\ Y + X \cdot Y + X \cdot Do\ Y = (X+Y) \cdot Do\ Y + X \cdot Y + X \cdot DO\ Y = X \cdot Y + X \cdot (Y \mathring{A} Do) \quad (1)$$

Figure 10:
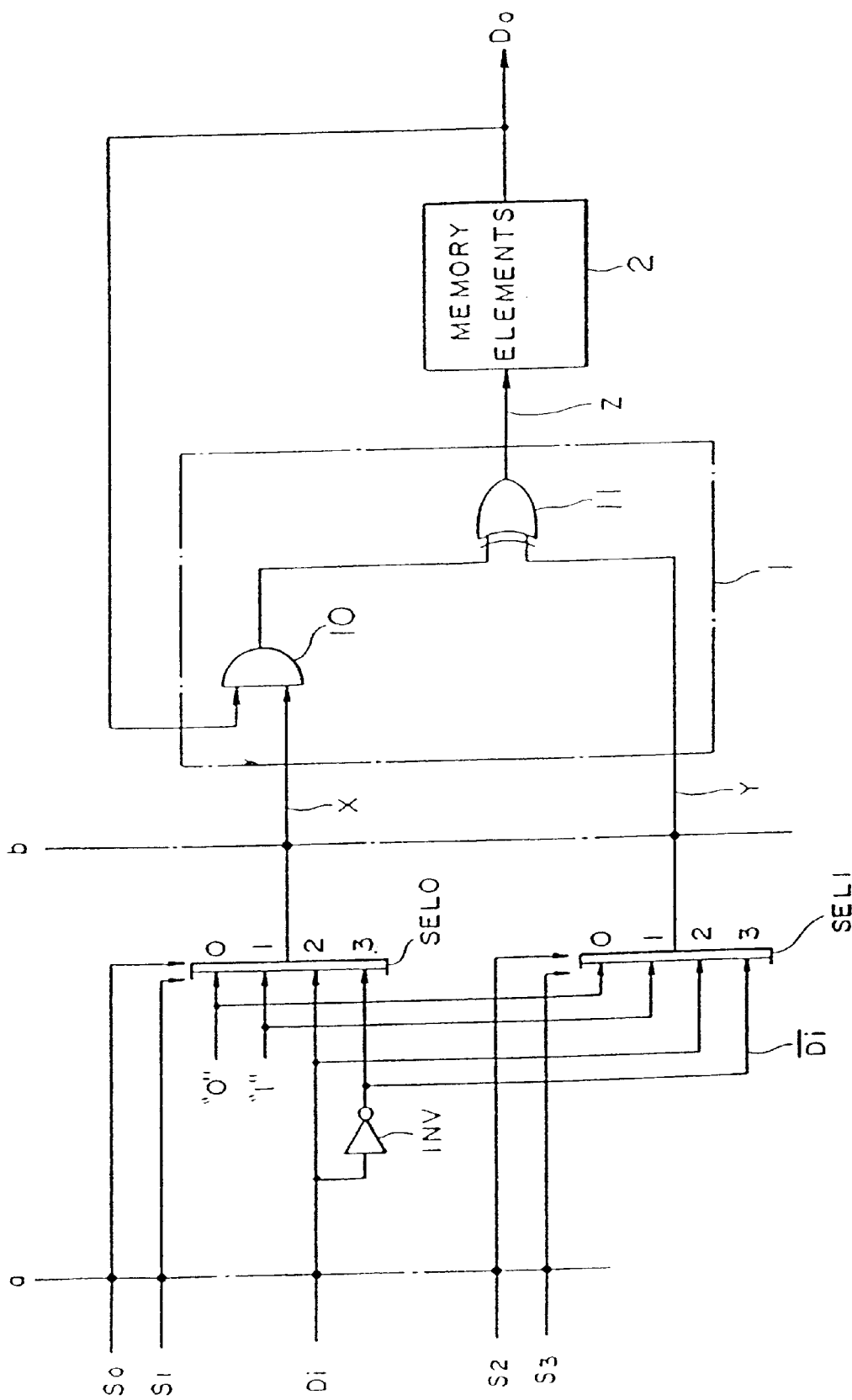
FIG. 10 is a block diagram depicting the configuration of a memory having a logic function.

Substituting the externally controllable data items X and Y with the applicable values of a signal "O", a signal "1", the bus data Di fed from the microprocessor, and the reversed data thereof appropriately Di, the operation results of the dyadic logic operations as shown in FIG. 9 will be obtained. FIG. 10. is a circuit diagram implemented by combining the dyadic operations of FIG. 9 with the processing system of the FIG. 5 embodiment. The system of FIG. 10 comprises four-input selectors SELf and SEL1, input select signals S0 and S1 to the selector SELf, input select signals S2 and S3 to the selector SEL1, and an inverter element INV.

Referring now to FIG. 1, and FIGS. 9–11, an operation example of a logic operation will be specifically described.

Figure 1:
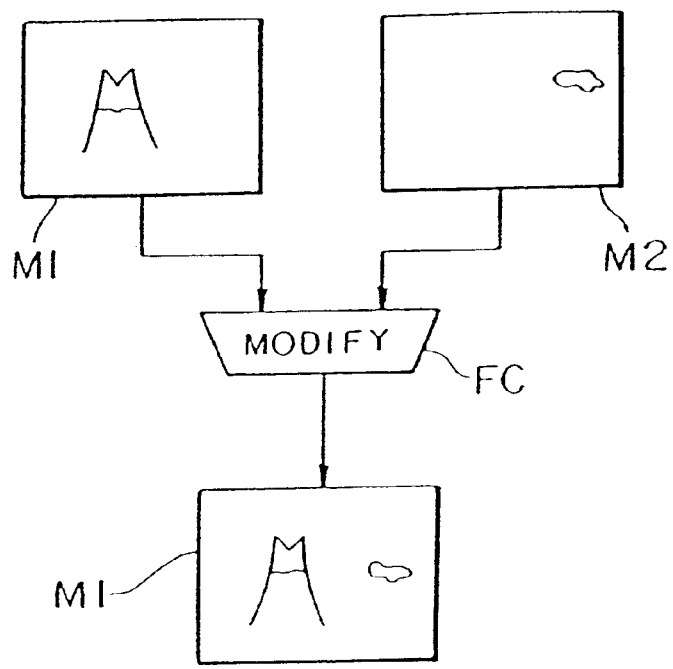
FIG. 1 is a schematic block diagram for explaining an operation to generate a composite graphic image in a graphic data processing system.
Figure 2:
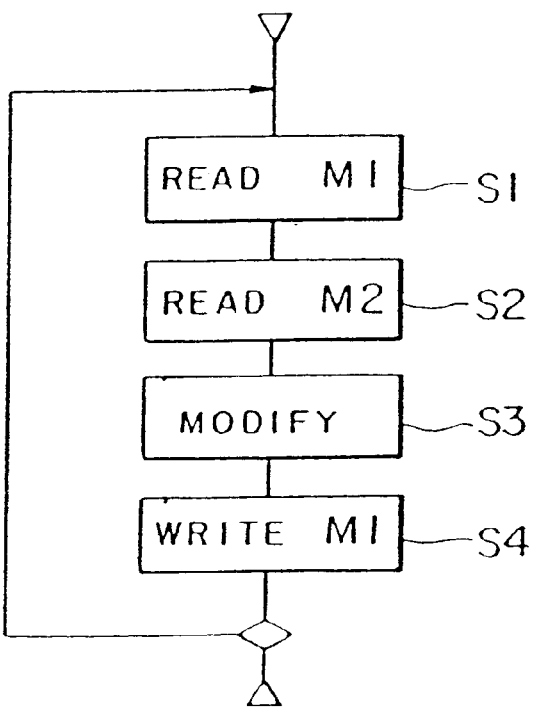
FIG. 2 is a flowchart of processing applied to the prior art technique to generate composite graphic data.

As shown in FIG. 9, the input select signals S0 and S1 are used as the select signals of the selector SELf to determine the value of data X. Similarly, the input select signals S2 and S3 are used to determine the value of data Y. The values that can be set to these data items X and Y include a signal "O", a signal "1", the bus data Di, and the inverted data thereof Di as described before. The selectors SELf and SEL1 each select one of these four signal values depending on the input select signals $S_0$ to $S_3$ as shown in FIG. 10. FIG. 9 is a table illustrating the relationships between the input select signals S0 to S3 and the data items X and Y outputted from the selectors SELf and SEL1, respectively, as well as the write data Z outputted from the control circuit 1. In graphic processing as shown in FIG. 1 (OR operation: Case 1), for example, the data items X and Y are selected as Di and Di, respectively when the input select signals are set as follows: SO, SI=(11) and $S_2$, $S_3$=(10). Substituting these values of X and Y in the expression (1) representing the operation of the control circuit 1, the OR operation, namely, Z=Di+Di Do=Di·(1+Do)+Di Do=Di+(Di+Di) Do=Di+Do is executed. In accordance with an aspect of the present invention, therefore, the graphic processing of FIG. 1 can be performed as shown in FIG. 11 in which the input select signals S0 to S1 are specified in the first step (function specification), a graphic data item to be combined is thereafter read from the storage area M2, and the obtained data item is stored in the graphic area only by use of a write operation.

Various logic functions can be effected by changing the values of S0 to S3 as depicted in FIG. 9. Consequently, an operation to draw a picture, for example, by use of a mouse cursor which is arbitrarily moved can be readily executed as shown in FIG. 12. Even when the mouse cursor (M2) overlaps with a graphic image in the graphic area M1 as illustrated in FIG. 12, the cursor must be displayed, and hence a function of the EOR operation is necessary. In this cursor display, when the input select signals are set as SO, S1=(10) and S2, S3=(01), the processing can be achieved as depicted in FIG. 11 in the same manner as the case of—the composite graphic 7c data generation described before. The various logic functions as listed in the table of FIG. 9 can be therefore easily implemented; furthermore, the Read-Modify-Write operation on the memory element unit 2 can—be accomplished only by a write operation.

By use of the circuit configuration of FIG. 10, the dyadic logic operations of FIG. 9 can be executed as a modify operation to be conducted between the data Di from the microprocessor and the read data Do from the memory elements unit 2. Incidentally, the input select signals are used to specify a dyadic logic operation.

Figure 11:
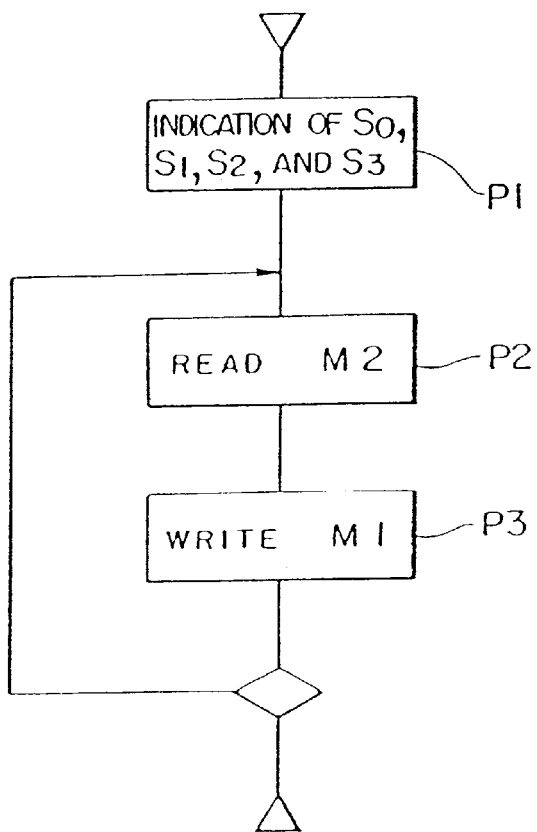
FIG. 11 is a flowchart of processing to generate composite graphic data by use of the memory of FIG. 10.
Figure 12:
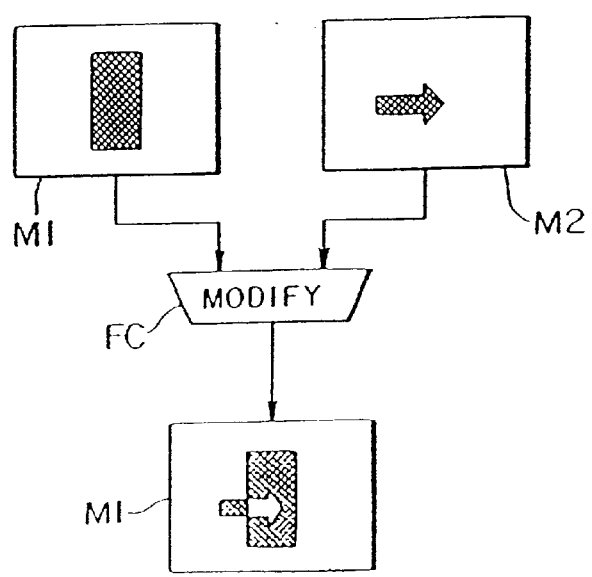
FIG. 12 is an explanatory diagram of processing to generate composite graphic data by use of an EOR logic function.

In accordance with the embodiment described above, the prior art processing to generate a composite graphic image can be simplified as depicted by the flowchart of FIG. 11.

The embodiment of the present invention described above comprises three functions as shown in FIG. 10, namely, a memory section including memory elements unit 2, a control section having the control circuit 1, and a selector section including the selectors SEIA and SELI. However, the function implemented by a combination of the control and selector sections is identical to the dyadic logic operation function described in conjunction with FIG. 9. Although this function can be easily achieved by use of other means, the embodiment above is preferable to simplify the circuit configuration.

Figure 13:
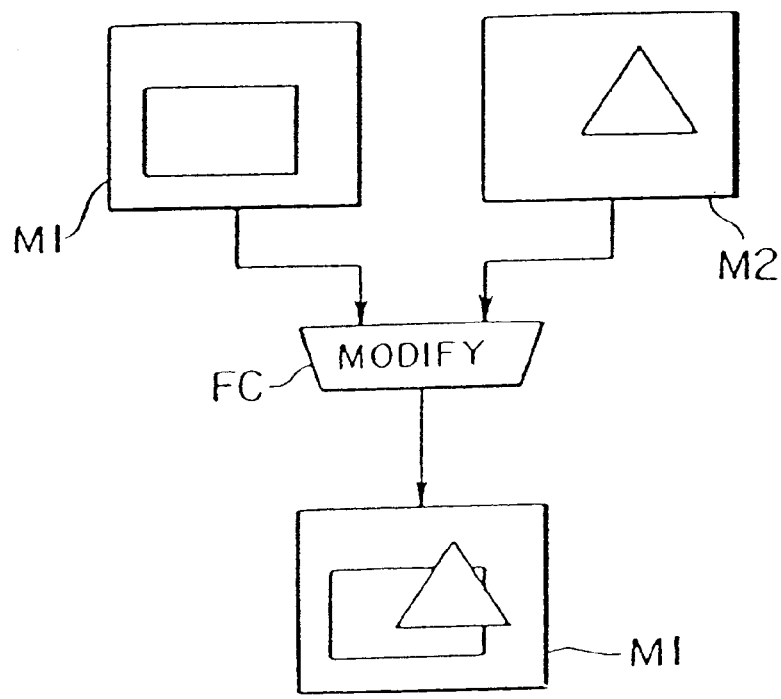
FIGS. 13–14 are schematic diagrams for explaining the processing to generate composite graphic data according to the present invention.
Figure 14:
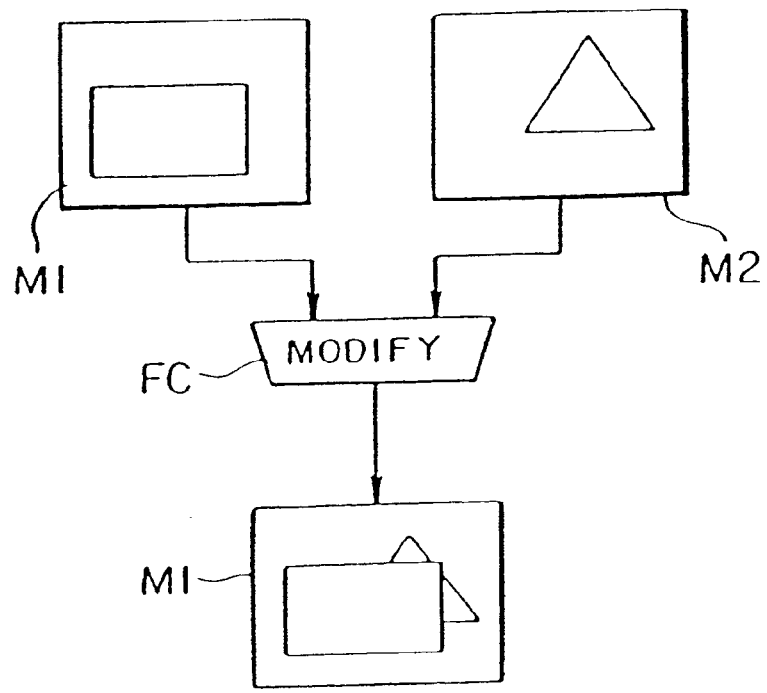

On the other hand, graphic processing is required to include processing in which graphic images and the like are overlapped as illustrated in FIGS. 13 14. In the first case, the graphic image in the store area M2 takes precedence over the graphic image in the graphic image area M1 when they are displayed as depicted in FIG. 13. In the second case, the graphic image in the graphic image area M1 takes precedence over the graphic image in the store area M2 as shown in FIG. 14.

The priority processing to determine the priority of graphic data as illustrated in FIGS. 13–14 cannot be achieved only by the logical function implemented by the FC section of FIG. 10) described above.

This function, however, can be early implemented by use of the memory circuit in an embodiment of the present invention namely, only simple logic and selector circuits need by added to the graphic processing system. An embodiment for realizing such a function will be described by referring to FIGS. 15–17. The FC section of FIG. 15 corresponds to a combination of the control circuit and the selectors SELf and SEL1. In this embodiment, the logic operation function (FC) section operates in the pass mode with the input select signals so to S3 of the selectors SELf and SEL1 set as (0, 0, 1, 0), for example.

Figure 15:
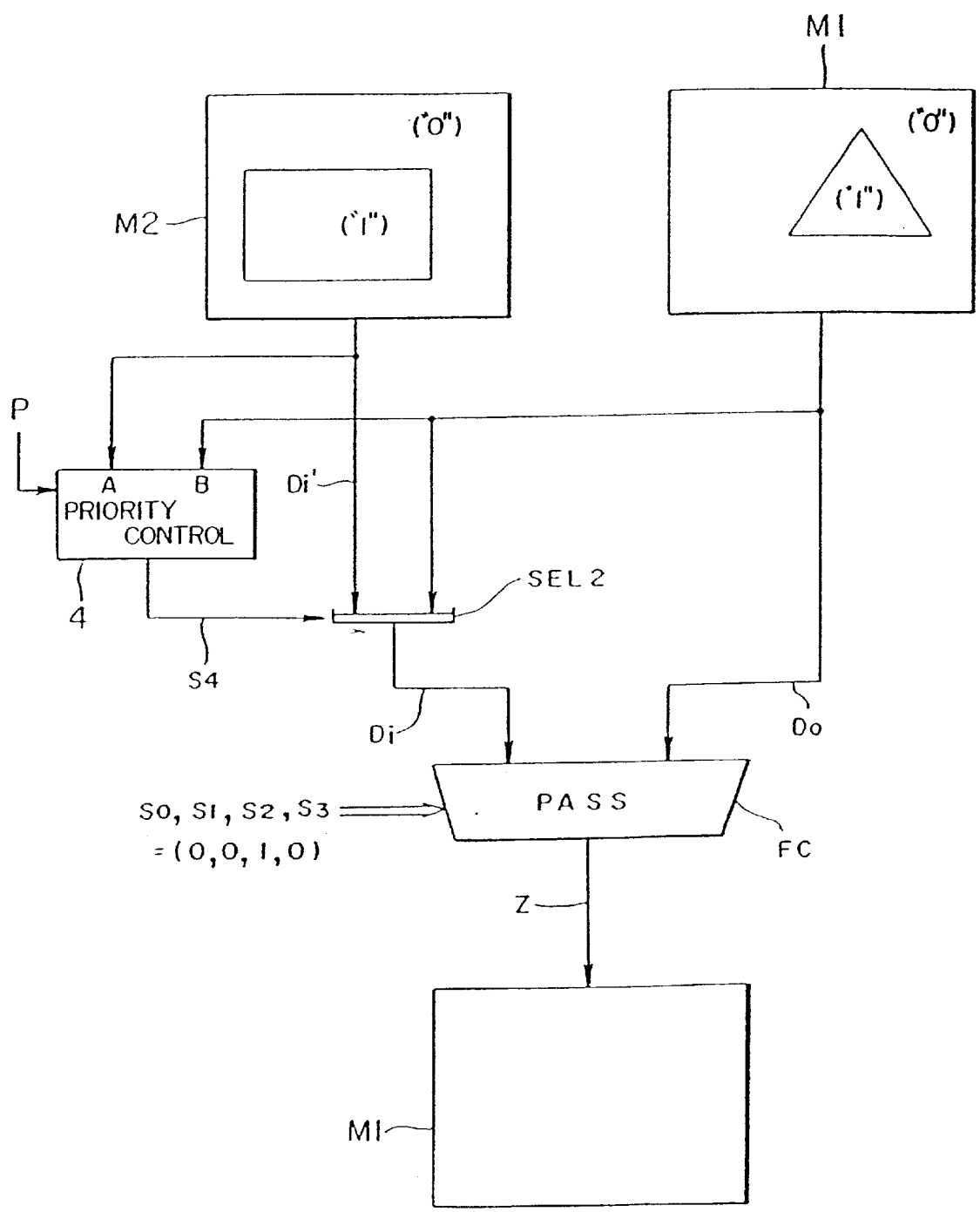
FIG. 15 is an explanatory diagram of an embodiment of the present invention.

The circuit block diagram of FIG. 15 includes a priority control section 4, a two-input selector SEL2, a priority specification signal P, an input select signal S4 to-the selector SEL2, a graphic data signal Di' from the store area M2, a graphic image area M1, a selected signal Di from selector SEL2, a graphic data signal Do from the graphic image area M1 (identical to the read data signal from the memory elements unit 2 shown in FIG. 10), and an output signal Z from the FC section (identical to the output signal from the control circuit 1 of FIG. 4). For the convenience of explanation, the graphic area is set to a logic value "1" and the background area is set to a logic value "0" as shown in FIG. 15. In this processing, the priority control section 4 and the selector SEL2 operate according to the contents of the truth table of FIG. 16. The relation-ships between the input select signal S4 and the input data Di to the logic operation function (FC) section are outlined in FIG. 16, where the signal S4 is determined by a combination of the priority specification signal P, the data Di' in the area M2, and the data Do from the area M1, and the input data Di is set by the signal S4.

In other words, the truth table of FIG. 16 determines an operation as follows. For example, assume that the graphic area to be used as the background is Mi. If the data items Do and Di' in the areas M1 and M2, respectively, are set to the effective data ("1"), the priority specification signal P is used to deter-mine whether the data Do of the background area M1 takes precedence (P=1), or the data Di' of the area M2 takes precedence (P=0).

That is, if a graphic image in the store area M2 is desired to be displayed over the graphic image of the graphic area M1, as illustrated in FIG. 13, the priority specification signal P is set to "0". Then, if the graphic data items Di' and Do, are in the graphic areas ("1") as depicted in FIG. 15, the data Di' of the store area M2 is preferentially selected by the selector SEL2. If the priority specification signal P is set to "1", the graphic processing is similarly executed according to the truth table of FIG. 16 as shown in FIG. 14.

Figures 16, 17:
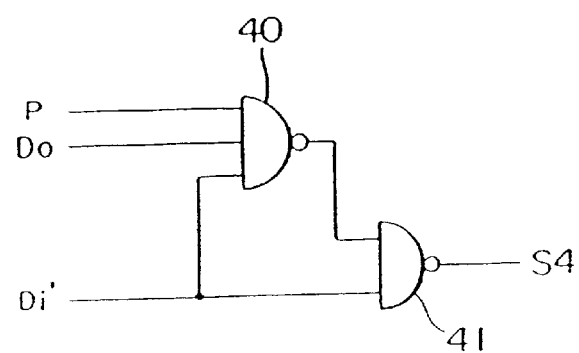
FIG. 16 is a table for explaining in detail the operation logic or the present invention.
FIG. 17 is a schematic circuit diagram of an embodiment of the present invention.

In FIG. 16, if the graphic areas ("1") are overlapped, the graphic area of the graphic area M1, or the store area M2, is selected depending on the priority specification signal P, and the data of the graphic area M1 is selected as the background for the area in which the graphic area does not exist.

FIG. 17 is a specific circuit diagram of the priority control section 4 depicted in FIG. 15. In this circuit diagram, reference numerals 40 and 41 indicate a three-input NAND circuit and a two-input NAND circuit respectively.

Figure 18:
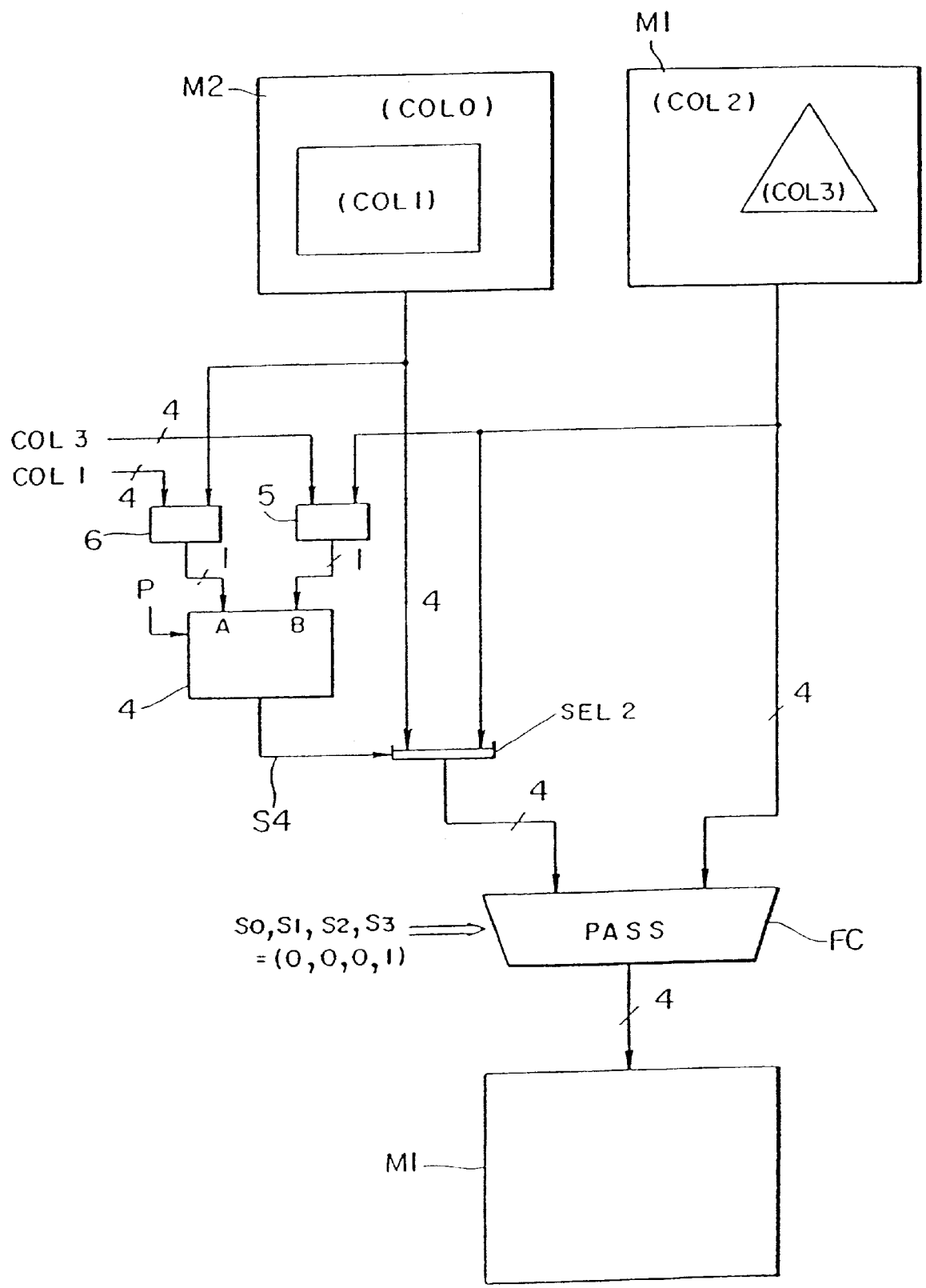
FIG. 18 is a circuit block diagram for explaining an embodiment applied to color data processing.

In order to apply the principle of priority decision to color data in which each pixel comprises a plurality of bits, the circuit must be modified as illustrated in FIG. 18.

The circuit of FIG. 18 includes a compare and determine section 5 for determining the graphic area (COL3) of the graphic area M1 and a compare and determine section 6 for determining the graphic area (COL1) of the store area M1. As described above, the priority comprises a plurality of bits, it is different from the circuit for processing information for which a pixel comprises a bit as shown in FIG. 15 in that the priority determination between significant data items is achieved by use of the code information (COLf to COL3) because the graphic data is expressed by the code information.

Consequently, in the case of color data, the overlapped graphic images can be easily processed by adding the compare and determine sections which determine the priority by comparing the code information.

The preceding paragraphs have described the priority determine circuit applied to an embodiment of the memory circuit having an operation function, however, it is clear that such embodiment can be applied to a simple memory circuit, or a memory circuit which has integrated shift register and serial outputs.

In accordance with this embodiment, the following effect is developed.

(1) When executing the processing as shown in FIG. 1, the processing flowchart of FIG. 11 can be utilized, and hence the memory cycle can be minimized.

(2) Three kinds of processing including the read, modify, and write operations can be executed only during a write cycle, which enables an increase in the processing speed.

(3) As depicted in FIGS. 16–18, the priority processing to be conducted when the graphic images are overlapped can be effected by the use of a plurality of simple logic gates.

(4) The graphic processing of color data can be also easily implemented by externally adding the compare and determine circuits for determining the graphic areas (code data comprising at least two bits).

(5) The size of the circuit configuration necessary for implementing the memory circuit according to the invention is quite small as compared with that of a group of memory elements, which is considerably advantageous to manufacture a large scale integration circuit in the same memory chip.

Figure 3:
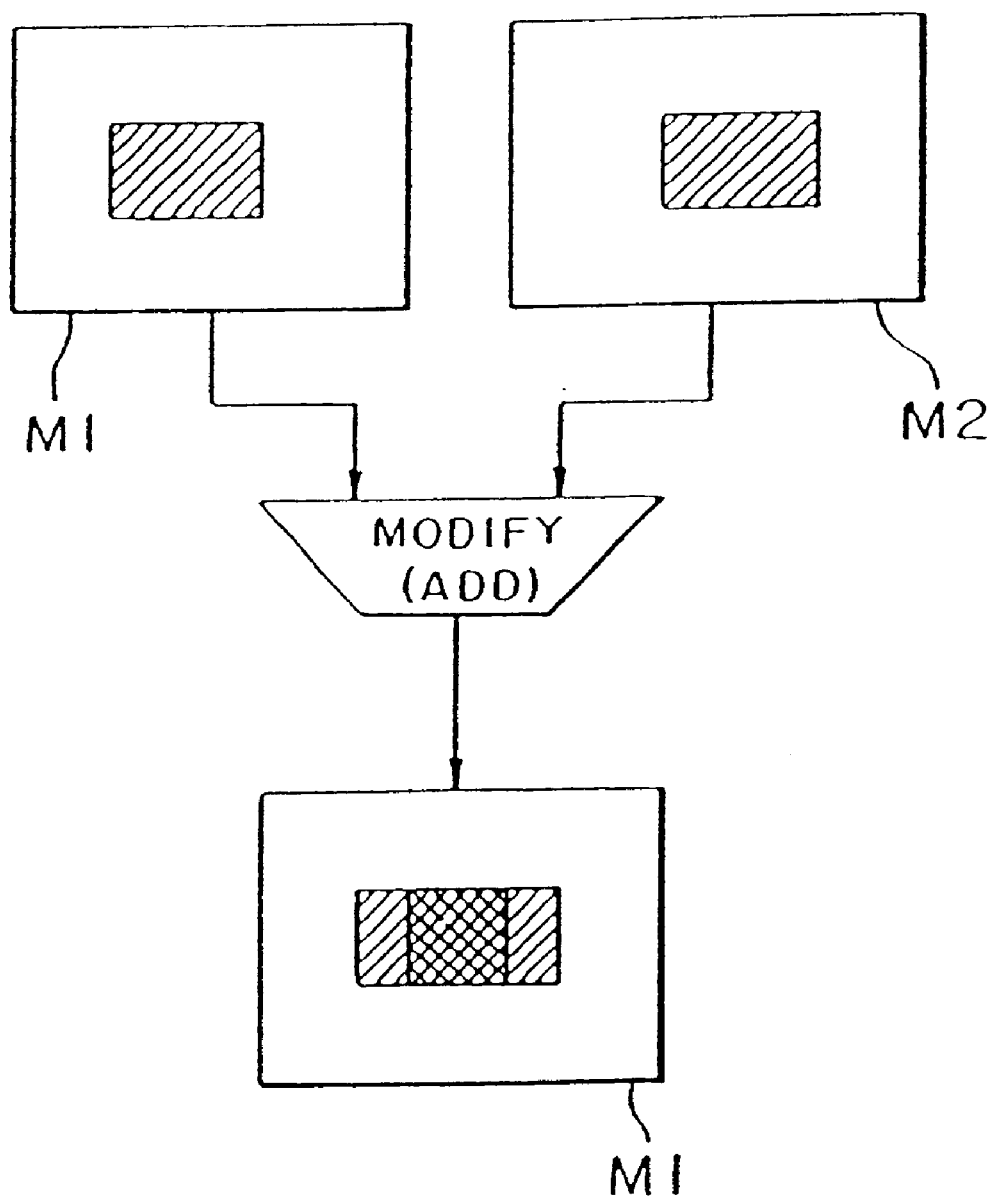
FIG. 3 is a schematic block diagram for explaining multivalued graphic data processing.

Next, another embodiment will be described in which processing to generate a composite graphic data represented as the multivalued data of FIG. 3 is executed.

Figure 19:
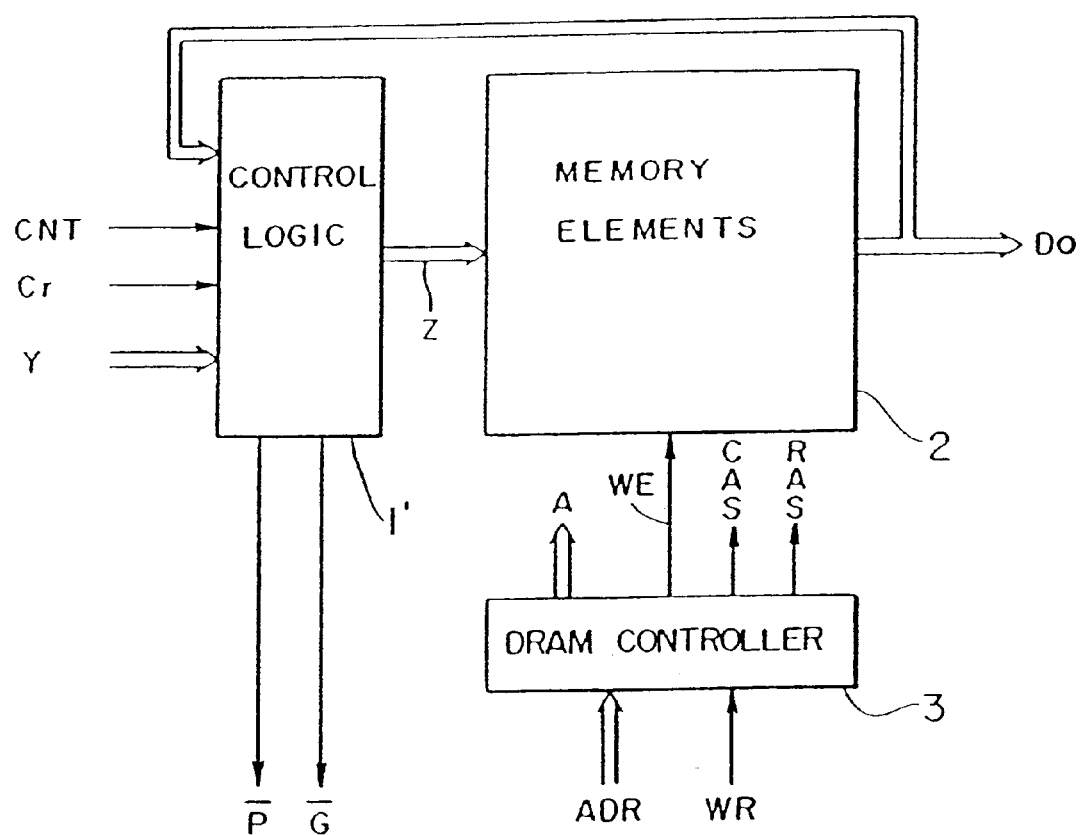
FIG. 19 is a block diagram illustrating a memory circuit of an embodiment of the present invention.

FIG. 19 is a circuit block diagram of a memory circuit applied to a case in which multivalued data is processed. This circuit is different from the memory circuit of FIG. 5 in the configuration of a control circuit 1'.

The configuration of FIG. 19 is adopted because the processing to generate a composite graphic data from the multivalued data indispensably necessitates an arithmetic operation, not a simple logic operation. As shown in FIG. 19, however, the basic operation is the same as depicted in FIG. 5.

In the following paragraphs, although the arithmetic operation is described, the circuit configuration includes the sections associated with the logic operation because the logic operation is also used for the multivalued graphic data processing. The circuit arrangement of FIG. 19 includes a control circuit 11, memory elements unit 2, a DRAM controller 3, external control signals CNT and Cr, data Y supplied from an external device, write data Z to the memory elements unit 2, read data Do from the memory elements unit 2, and signals A, WE, CAS, RAS, ADR, and WR which are the same as those shown in FIG. 5.

In the embodiment as shown in FIG. 19, the control circuit 11 performs an operation on the read data Do and the external data Y according to the external control signals CRT and Cr; and the operation result, write data Z is written in the memory elements 2. FIG. 20 is a table illustrating the control operation modes of the control circuit 1'. When the external control signals CRT and Cr are set to f, the control circuit 1' operates in a mode where the external data Y is used as a control signal to determine whether or not the read data Do is subjected to an inversion before it is outputted; when the signals CRT and Cr are set to 0 and 1, respectively, the control circuit 1' operates in a mode where the external data Y is outputted without change; and when the signals are set to 1, the control circuit 1' operates in a mode where the read data Do, the external data Y, and the external control signal Cr are arithmetically added.

Figure 21:
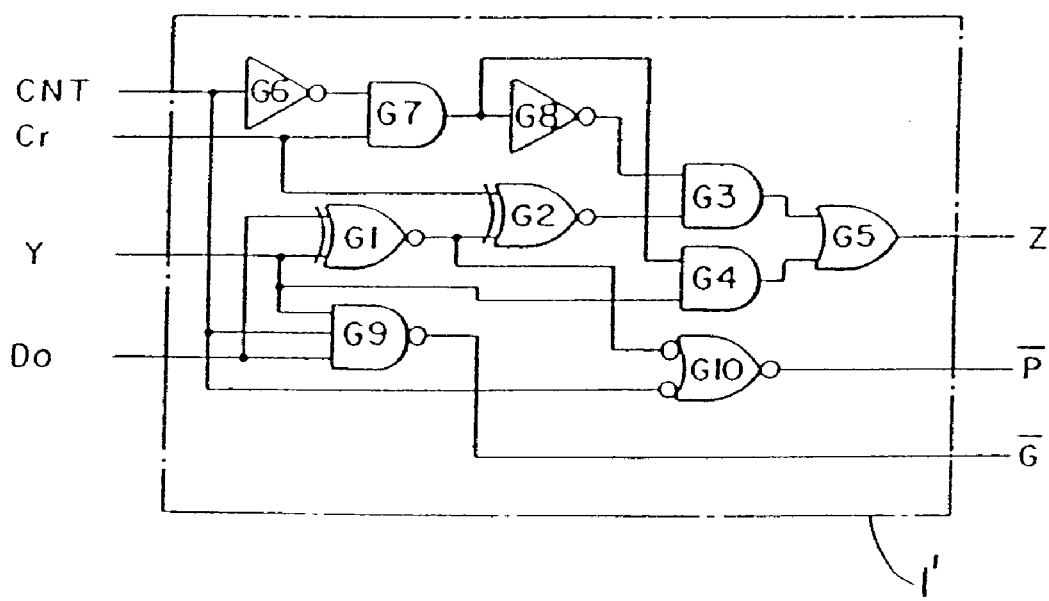
FIG. 21 is a schematic diagram illustrating an example of the control circuit configuration.

FIG. 21 is a specific circuit diagram of a circuit implementing the control operation modes. In this circuit arrangement, the arithmetic operation is achieved by use of the ENOR gates G1 and G2, and the condition that the external control signals CRT and Cr are f and 1, respectively is detected by the gates G6 to G8, and the output from the ENOR gate or the external data Y is selected by use of a selector constituted from the gates G3 to G5. This circuit configuration further includes a NAND gate G9 for outputting a generate signal associated with the carry lookahead function provided to minimize the propagation delay of the carry and an AND gate GIO for generating a propagate signal similarly associated with the carry lookahead function. The logical expressions of the output signals Z, P, and G from the control circuit I' are as listed in FIG. 21, where the carry lookahead signals P and G each are set to fixed values (P=0, G=1) if the external control signal CNT is f.

Figure 22:
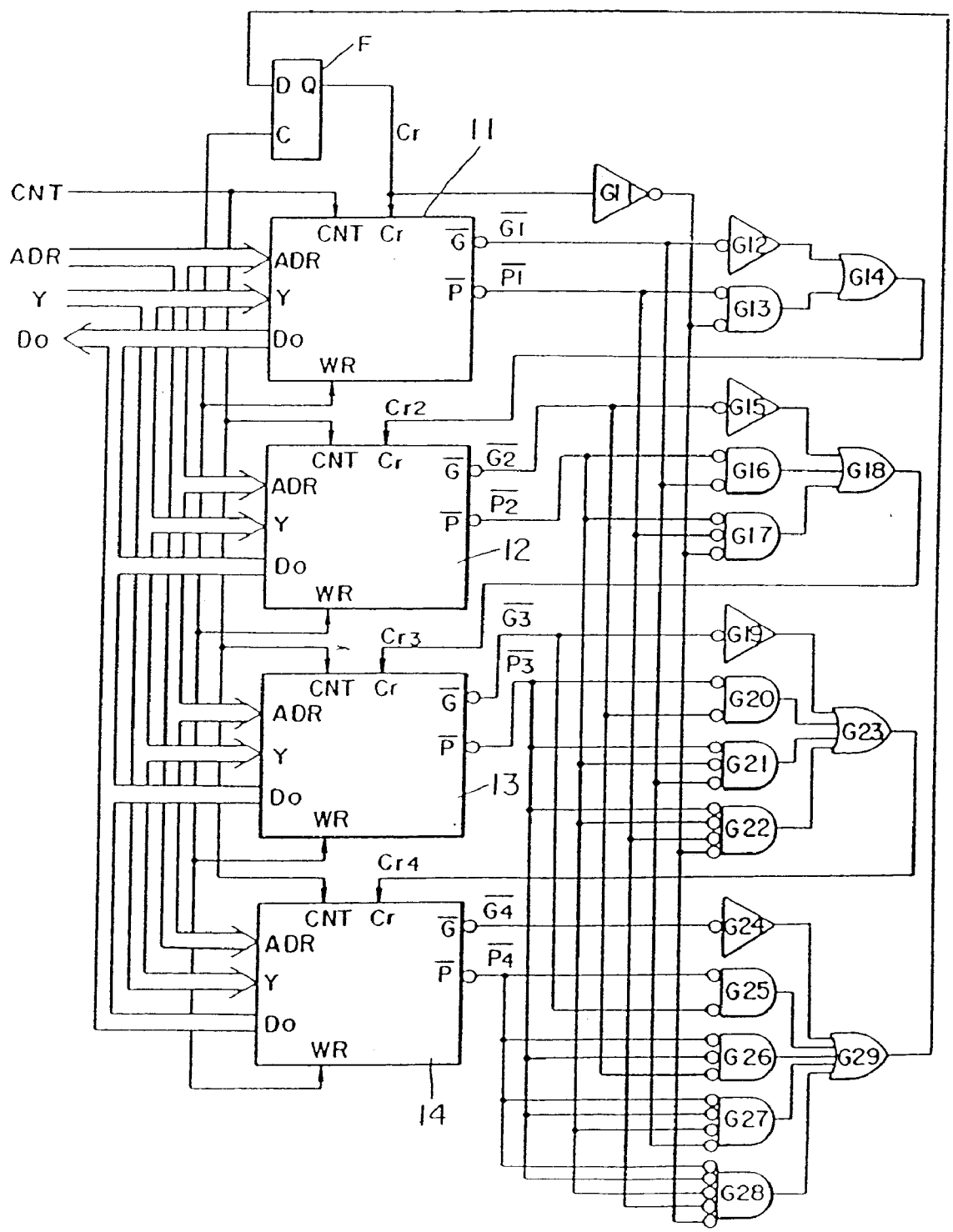
FIG. 22 is a circuit block diagram depicting an example of a 4-bit operational memory configuration.

FIG. 22 is the configuration of a four-bit operation memory utilizing four memory circuits for the embodiment. For simplification of explanation, only the sections primarily associated with the arithmetic operation mode are depicted in FIG. 22. The circuit diagram includes the memory circuits 11–14 shown in FIG. 19, gates G11 to G28 constituting a carry lookahead circuit for achieving a carry operation, and a register F for storing the result of a carry caused by an arithmetic operation. The memory circuits 11 and 14 are associated with the least and most-significant bits, respectively.

Although not shown in this circuit configuration to simplify the circuit arrangement, the register F is connected to an external circuit which sets the content to f or 1. The logical expression of the carry result, namely, the output from the gate G29 is as follows.

$$G4+G3 \cdot P4+G2 \cdot P3 \cdot P4+G1 \cdot P2 \cdot P3 \cdot P4+Cr \cdot P1 \cdot P2 \cdot P3 \cdot P4$$

When the external control signal CNT is f, Pi and Gi are set to 1 and f, respectively (where, i indicates an integer ranging from one to four), and hence the logical expression includes only the signal Cr, which means that the value of the register F is not changed by a write operation. Since the intermediate carry signals Gr2 to Gr4 are also set to the value of the signal Cr, three operation states are not changed by a write operation when the external control signal CNT is f. If the external control signal CNT is 1, the carry control signals P1 to P4 and G1 to G4 of the memory circuits 11–14, respectively function as the carry lookahead signals, so an ordinary addition can be conducted.

As shown in FIG. 20, although the control circuit has a small number of operation modes, the operation functions can be increased by selecting the logic value f, the logic value 1, the write data D to a microprocessor or the like, and the inverted data D of the write data D as the inputs Of the external control signal Cr and the external data Y.

Figure 23A:
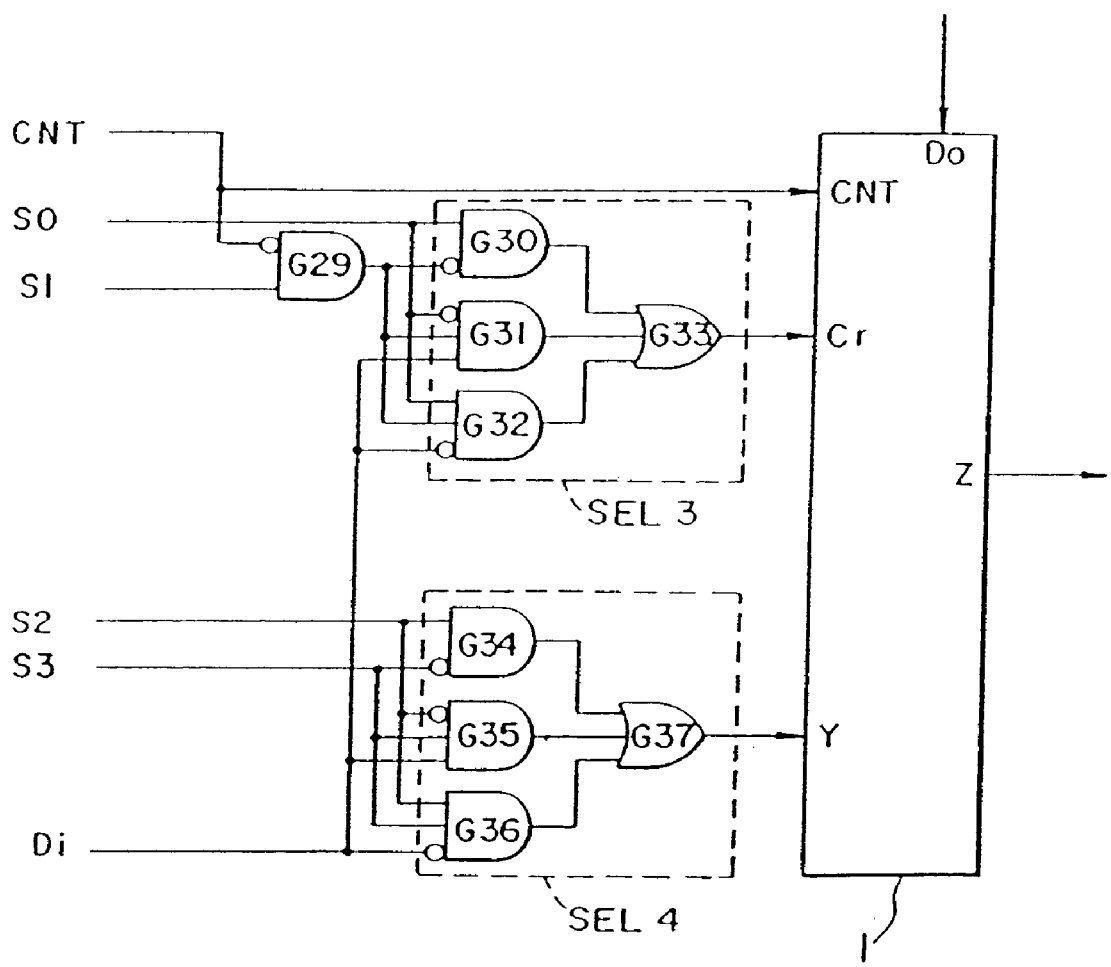
Figure 23C:
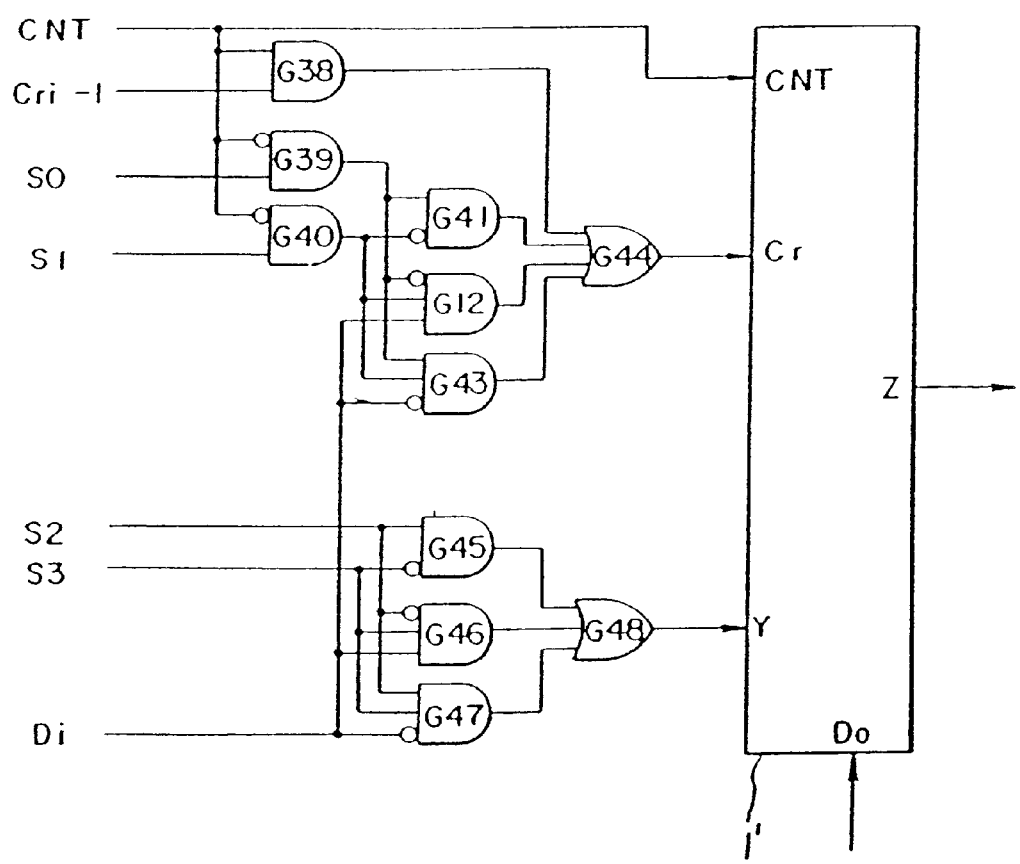

FIGS. 23a to 23c illustrate an example in which the above-mentioned circuits are combined. FIG. 23a is a specific representation of a circuit for the least significant bit, whereas FIG. 22b is a table outlining the operation functions of the circuit of FIG. 23a.

In the following paragraphs, the circuit operation will be described only in the arithmetic operation mode with the external control signal CNT set to 1.

Figure 24:
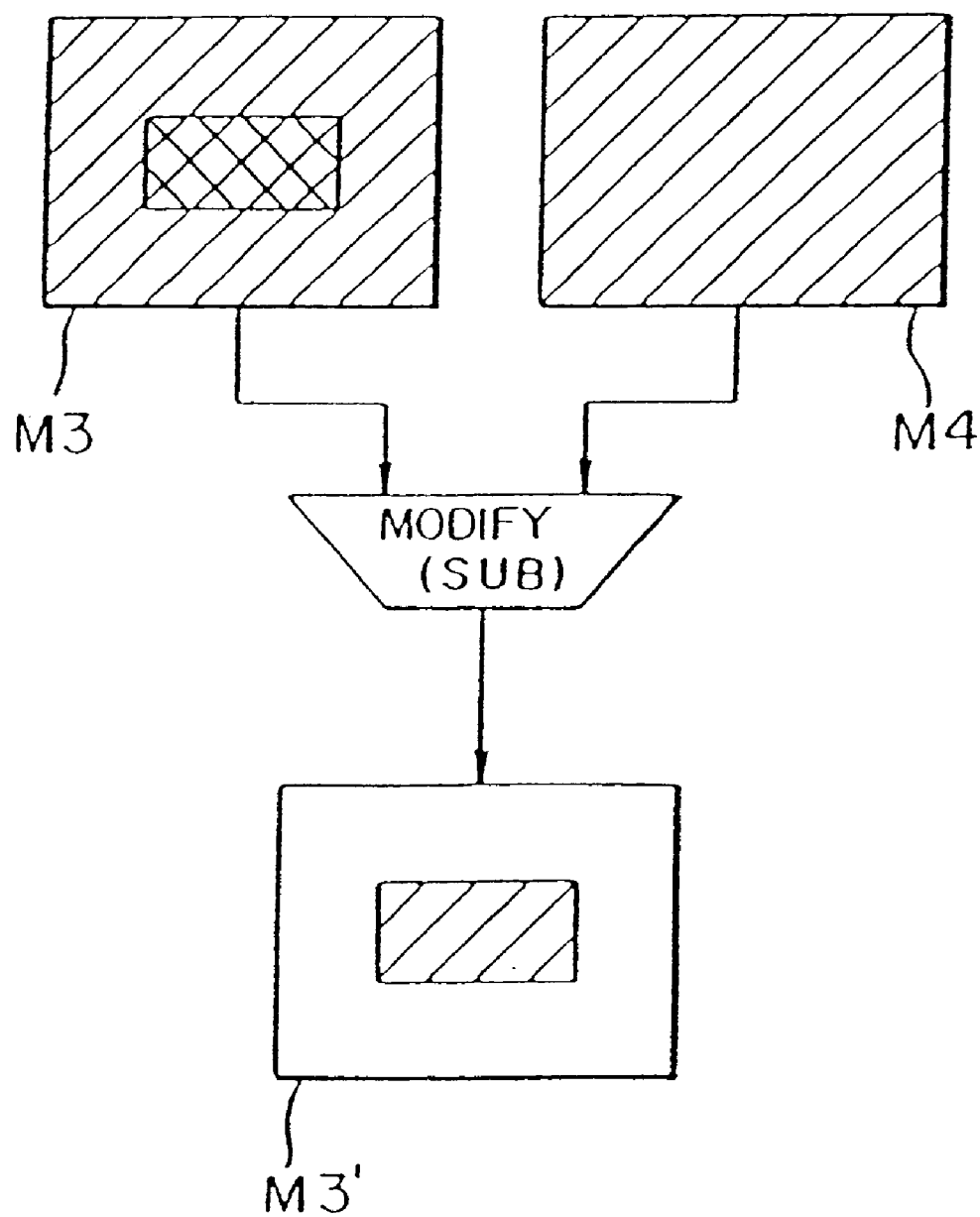
FIG. 24 is a schematic diagram for explaining processing to delete multivalued graphic data.

Gates G29–G33 constitute a selector (SEL3) for the external control signal Cr, while gates G34–G37 configure a selector (SEL4) for the external data Y. The circuit arrangement of FIG. 23a comprises select control signals Sf and S1 for selecting the external control signal Cr and select control signals S2 and S3 for selecting the external data Y. FIG. 23c depicts a circuit for the most-significant bit. This circuit is different from that of FIG. 23a in that the selector for the signal Cr is constituted from the gates G38–G44 so that a carry signal Cri-I from the lower-order bit is inputted to the external control signal Cr when the external control signal CNT is 1. The selector for the external data Y is of the same configuration of that of FIG. 23a. In the circuit configuration of FIG. 23c, the memory circuit arrangement enables to achieve 16 kinds of logical operations and six kinds of arithmetic operations by executing a memory write access. For example, the processing to overlap multivalued graphic data as shown in FIG. 3 is carried out as follows. First, the select signals S0 to S3 are set to 0, 0, 0, and 1, respectively and the write data Z is specified for an arithmetic operation of Do Plus 1. A data item is read from the multivalued graphic data memory M2 and the obtained data item is written in the destination multivalued graphic data area M1, which causes each data to be added and the multivalued graphic data items are overlapped at a higher speed. Similarly, if the select signals Sf to S3 are set to 1 and the write data Z is specified for a subtraction of Do Minus Di, the unnecessary portion (such as the noise) of the multivalued graphic data can be deleted as depicted in FIG. 24. Like the case of the overlap processing, this processing can be implemented only by executing a read operation on the data memory M3 containing the data from which the unnecessary portion is subtracted and by repeating a write operation thereafter on the destination data memory M3, which enables higher-speed graphic processing.

According to the above embodiments, (1) The multivalued graphic data processing is effected by repeating memory access two times, and hence the processing such as the graphic data overlap processing and subtraction can be achieved at a higher speed;

(2) Since the data operation conducted between memory units is implemented on the memory side, the multivalued graphic processing can be implemented not only in a device such as a microprocessor which has an operation function but also in a device such as a direct memory access (DMA) controller which has not an operation function; and (3) The carry processing is conducted when a memory write access is executed by use of the circuit configuration as shown in FIG. 22, so the multiple-precision arithmetic operation can be implemented only by using a memory write operation, thereby enabling a multiple-precision arithmetic operation to be achieved at a higher speed.

It is also possible to perform the dyadic operation and the arithmetic operation on graphic data at a higher speed. Moreover, the priority processing to be utilized when graphic images overlap and processing for color data can be readily implemented.

Figure 25:
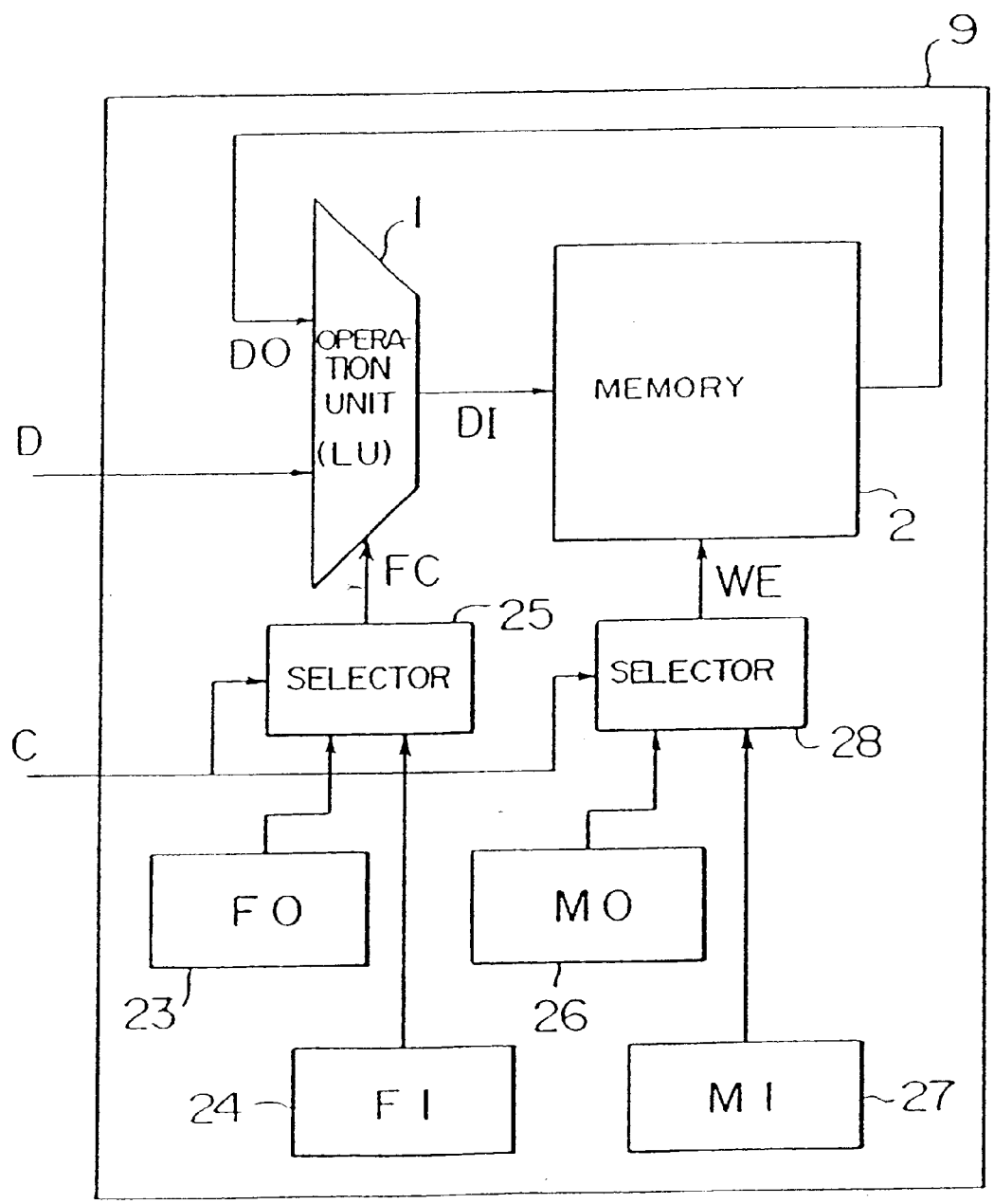
FIG. 25 is a block diagram showing the memory circuit embodying the present invention.
Figure 28:
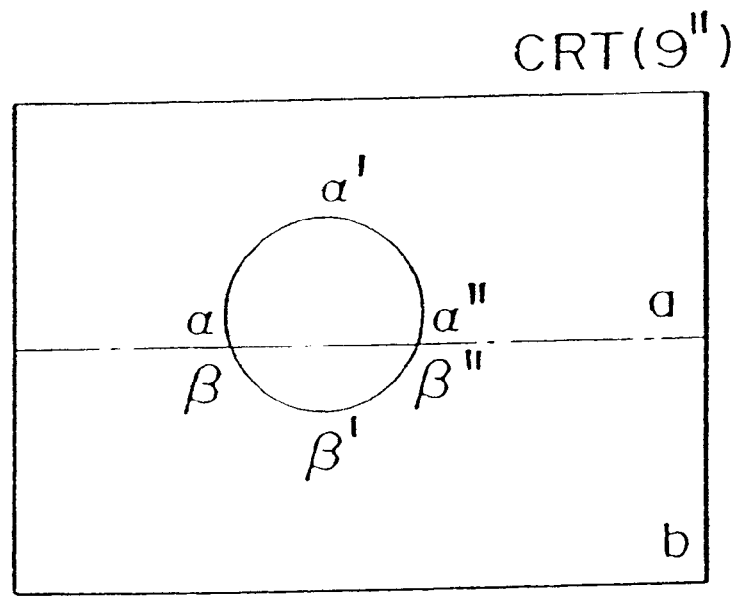
FIG. 28 is a diagram explaining a two processor graphic display.

FIG. 25 shows a frame buffer memory circuit including an operation unit (LU) 1 for implementing the modification functions for the read-modify-write operation, a data memory 2, operational function specifying registers 23 and 24 for specifying an operational function of the operation unit, an operational function selector 25 for selecting an operational function, write mask registers 26 and 27 for holding write mask data, and a write mask selector 28 for selecting write mask data. Symbol D denotes write data sent over the common bus, and symbol C denotes a selection signal for controlling the operational function selector 5 and write mask selector 28.

Figure 30:
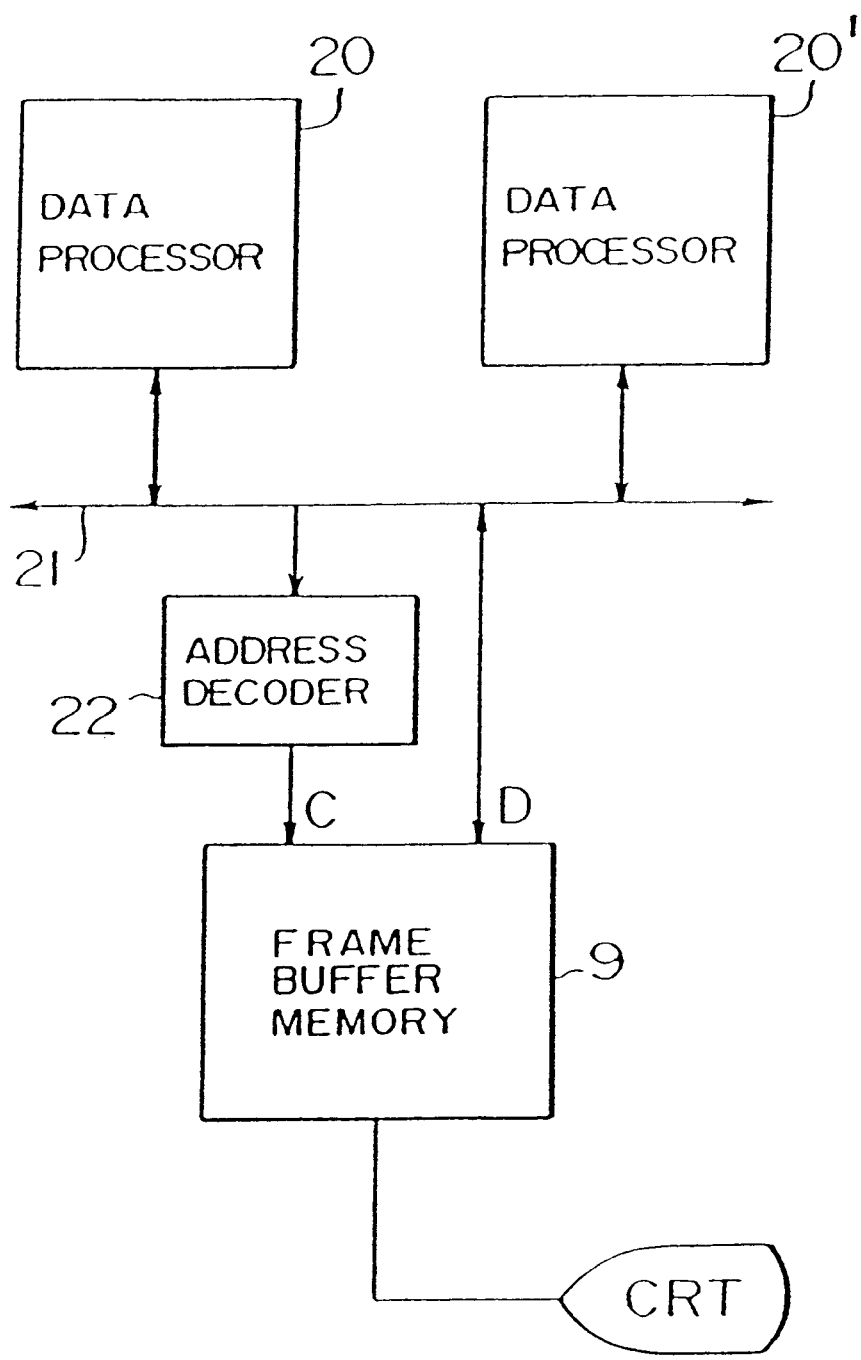
FIG. 30 is a block diagram showing the multi-processor graphic display system embodying the present invention.

FIG. 30 is a block diagram showing the application of the inventive frame buffer memory circuit 9 shown in FIG. 25 to the multi-processor system, in which are included data processors 20 and 20', a common bus 21 and an address decoder 22.

The following describes, as an example, the operation of this embodiment. For clarification purposes, FIGS. 25 and 30 do not show the memory read data bus, memory block address decoder and read-modify-write control circuit, all of which are not essential for the explanation of this invention In this embodiment, the memory circuit 9 is addressed from 800000H to 9FFFFFH. The memory circuit 9 itself has a 1M byte capacity in a physical sense, but it is addressed double in the range 800000H–9FFFFFH to provide a virtual 2M byte address space. The method of double addressing is such that address 800000H and address 900000H contain the same byte data, and so on, and finally address 8FFFFFH and address 9FFFFFH contain the same byte data. Accordingly, data read by the processor 20 at address 8xxxxxH is equal to data read at address 9xxxxxH, provided that the address—section xxxxx is common. The reason for double addressing the memory circuit 9 beginning with address 800000H and address 900000H is to distinguish accesses by the data processors 20 and 201. Namely, the data processor 20 is accessible to a 1M byte area starting with 800000H, while the-processor 20, is accessible to a 1M byte area starting with 900000H. The address decoder 22 serves to control the double addressing system, and it produces a "0" output in response to an address signal having an even (8H) highest digit, while producing a "1" output in response to an address signal having an odd (9H) highest digit.

The operation unit I has a function set of 16 logical operations as listed in FIG. 31. In order to specify one of the 16 kinds of operations, the operation code data FC is formatted in 4 bits, and the operational function specifying registers 23 and 24 and operational function selector 25 are all arranged in 4 bits. Since the memory 2 is of the 16-bit word length, the write mask registers 26 and 27 and mask selector 28 also have 16 bits.

Figure 39:
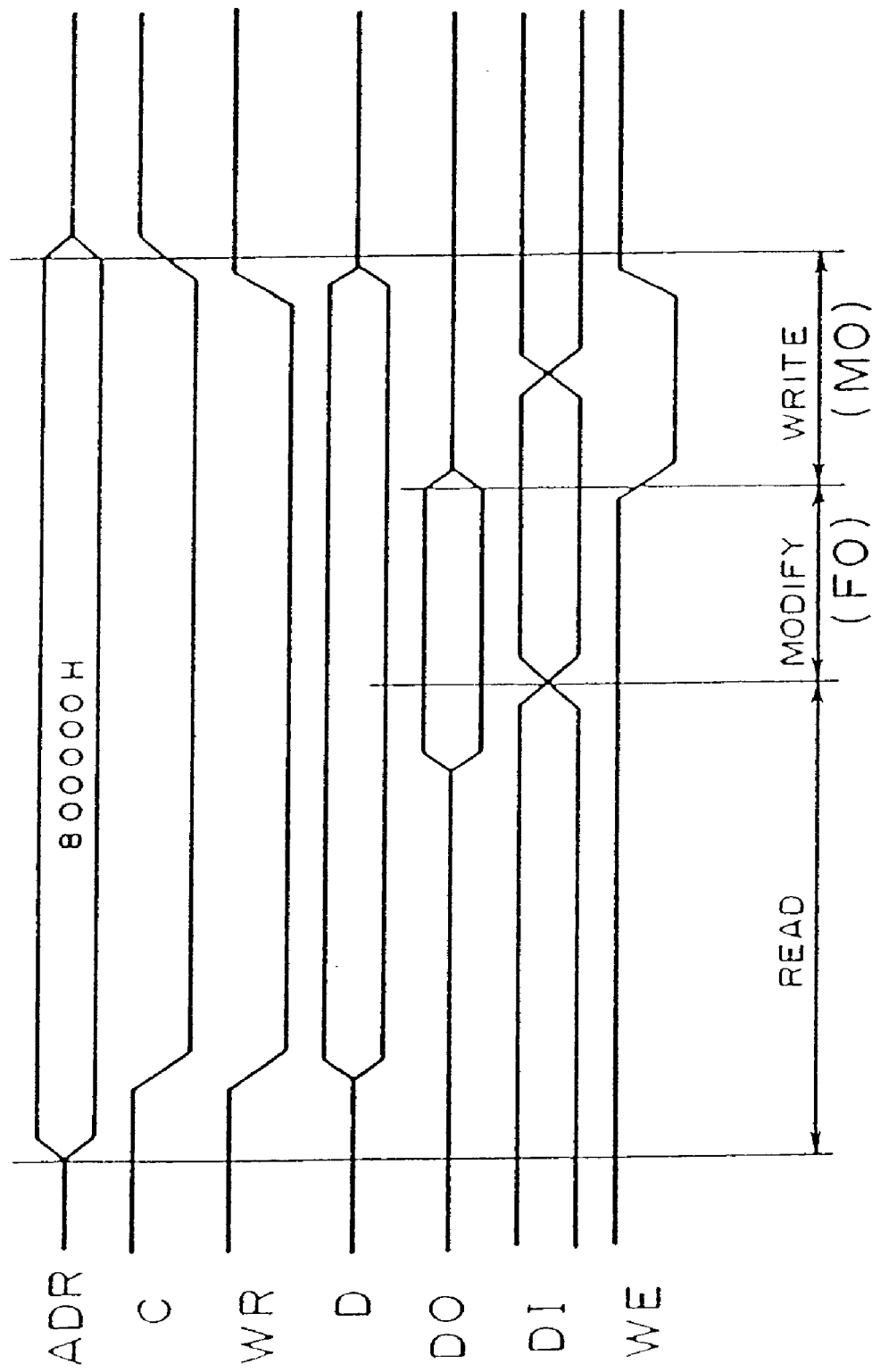
FIG. 39 is a timing chart showing the memory write timing relationship derived from FIG. 37, but with the addition of the selection signal.

Next, the operation of the data processor 20 in FIG. 30 in making write access to the frame buffer memory 9 will be described. The data processor 20 has a preset of function code FO in the operational function specifying register 23 and mask data MO in the write mask register 26. When the data processor 20 makes write access to address 800000H, for example. the memory access operation takes place in the order of reading, modifying and writing in the timing relationship as shown in FIG. 39. In response to the output of address 800000H onto the address bus by the data processor 20, the address decoder 22 produces a "0" output, the operational function selector 25 selects the operational function specifying register 23, and the operation unit 1 receives F0 as operation code data FC. At this time, the write mask selector 28 selects the write mask register 26, and it outputs MO as WE to the memory 2. In FIG. 39, data in address SOOOOOH is read out in the read period, which is subjected to calculation with write data D from the data processor 20 by the operation unit 1 in accordance with the calculation code data FO in the modification period, and the result is written in accordance with data MO in the write period. The write mask data inhibits writing at "0" and enables writing at "1", and the data MO is given value FFH for the usual write operation.

When another data processor 20' makes-access to the frame buffer 9, function code F1 is preset in the operational function specifying register 24 and mask data M1 is preset in the write mask register 27. In order for the data processor 201 to access the same data as one in address 800000H for the data processor 20, it makes write access to address 900000H. The write access timing relationship for the data processor 201 is similar to that shown in FIG. 39, but differs in that the output signal C of the address decoder 22 is "1" during the access, the function code for modification is F1, and the write mask is M1 in this case.

Figure 29:
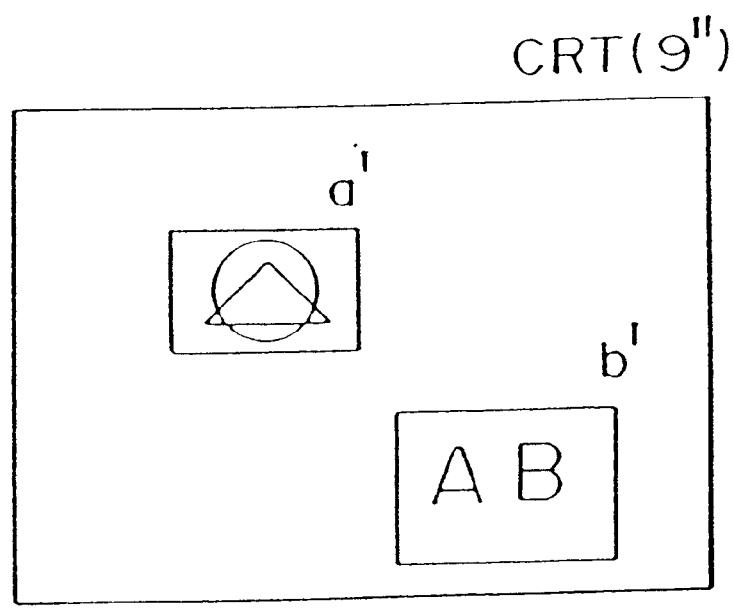
FIG. 29 is a diagram showing a graphic display by one processor a character display by another processor.

Accordingly, by making the data processors 20 and 20' access different addresses, the calculation and mask data can be different, and the operational functions need not be set at each time even when the processors implement different display operations as shown in FIG. 29.

Next, the arrangement of the frame buffer memory 9 and the method of setting the operational function according to this embodiment will be described.

Figure 32:
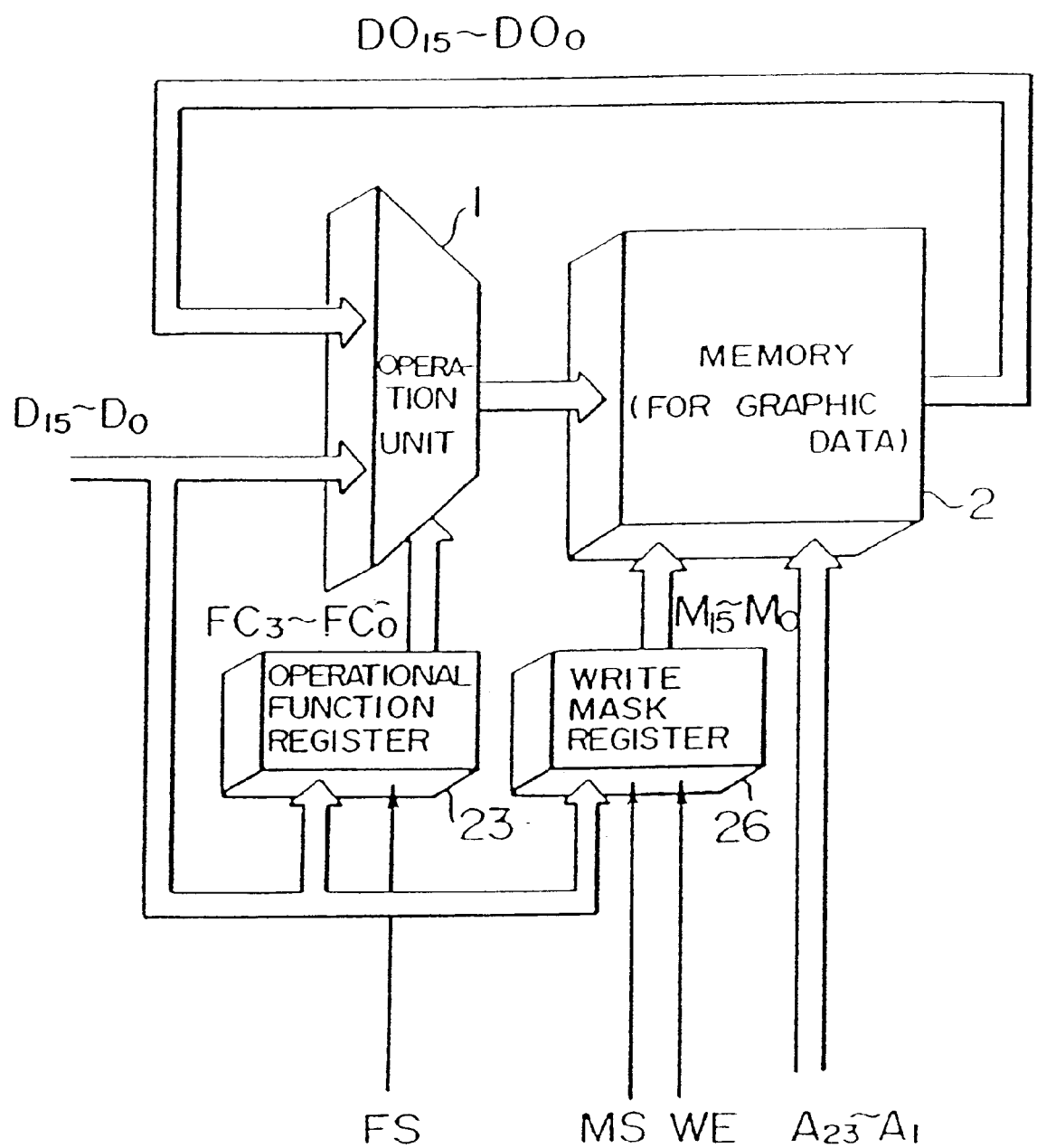
FIG. 32 is a block diagram showing the arrangement of the conventional frame buffer memory.

FIG. 32 shows a typical arrangement of the frame buffer. Conventionally, a memory has been constructed using a plurality of memory IC (Integrated Circuit) components with external accompaniments of an operation unit 1, operational function specifying register 23 and write mask register 26. The reason for the arrangement of the memory using a plurality of memory IC components is that the memory capacity is too large to be constructed by a single component. The memory is constructed divisionally, each division constituting 1, 3 or 4 bits or the like of data words (16-bit word in this embodiment). For example, when each division forms a bit of data words, at least 16 memory IC components are used. For the same reason when it is intended to integrate the whole frame buffer shown in FIG. 32, it needs to be divided into several IC components.

The following describes the method of this embodiment for setting the operational function and write mask data for the sliced memory structure. The setting method will be described on the assumption that a single operational function specifying register and write mask register are provided, since the plurality of these register sets is not significant for the explanation.

Currently used graphic display units are mostly arranged to have operational functions of logical bit operations, and therefore it is possible to divide the operation unit into bit groups of operation data. It is also possible in principle to divide the operation unit on a bit slicing basis also for the case of implementing arithmetic operations, through the additional provision of a carry control circuit. The write mask register 26 is a circuit controlling the write operation in bit units, and therefore it can obviously be divided into bit units. The operational function specifying register 23 stores a number in a word length determined from the type of operational function of the operation unit 1, which is independent of the word length of operation data (16 bits in this embodiment), and therefore it cannot be divided into bit groups of operation data. On this account, the operational function specifying register 23 needs to be provided for each divided bit group. Although it seems inefficient to have the same functional circuit for each divided bit group, the number of elements used for the peripheral circuits is less than 1% of the memory elements, and the yearly increasing circuit integration density makes this matter insignificant. However, in contrast to the case of slicing the operational function specifying register 23 into bit groups, partition of the frame buffer-shown in FIG. 32 into bit groups of data is questionable. The reason is that the operational function specifying register 23 is designed to receive data signals D15–DO. When the frame buffer is simply sliced into 1-bit groups, the operational function specifying register 23 can receive 1-bit data and it cannot receive a 4-bit specification code listed in FIG. 31. If, on the other hand, it is designed to supply a necessary number of 1-bit signals to the operational function specifying register 23, the frame buffer must have terminals effective solely for the specification of operational functions, and this will result in an increased package size when the whole circuit is integrated. If it is designed to specify the operational function using the data bus, the number of operational functions becomes dependent on bit slicing of data, and to avoid this the frame memory of this embodiment is intended to specify operational functions using the address but which is independent of bit slicing.

Figure 33:
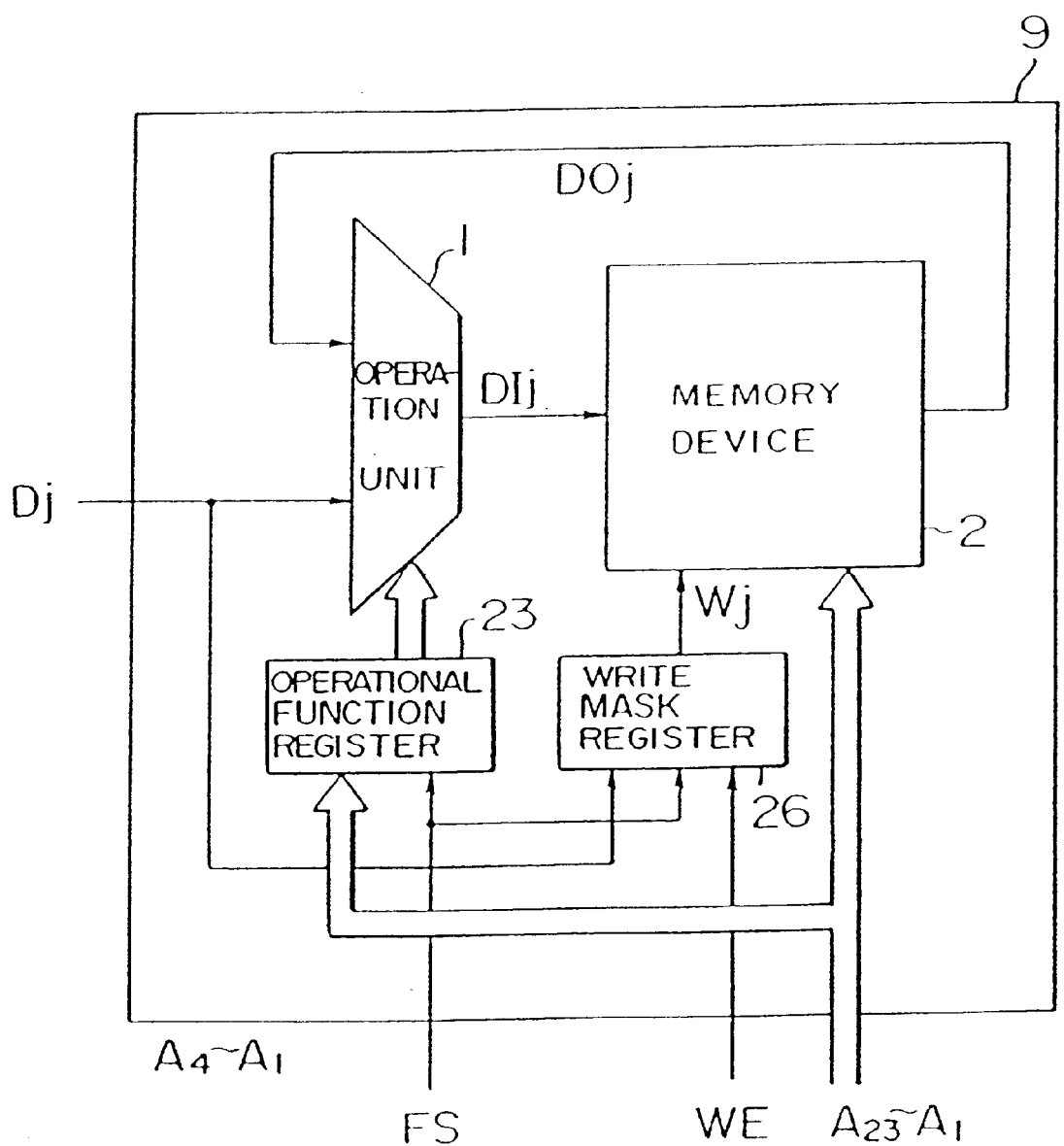
FIG. 33 is a block diagram showing the arrangement of the memory circuit embodying the present invention.

FIG. 33 shows, as an example, the arrangement of the frame buffer memory which uses part of the address signals for specifying operational functions. Symbol Dj denotes a 1-bit signal in the 16-bit data signals to the graphic display data processor, A23–A1 are address signals to the data processor, WE is the write control signal to the data processor, FS is the data setting control signal for the operational function specifying register 3 and write mask register 26, DOj is a bit of data read out of the memory device 2, DIj is a bit of data produced by the operation unit 1, and Wj is the write control signal to the memory device 2.

Figure 34:
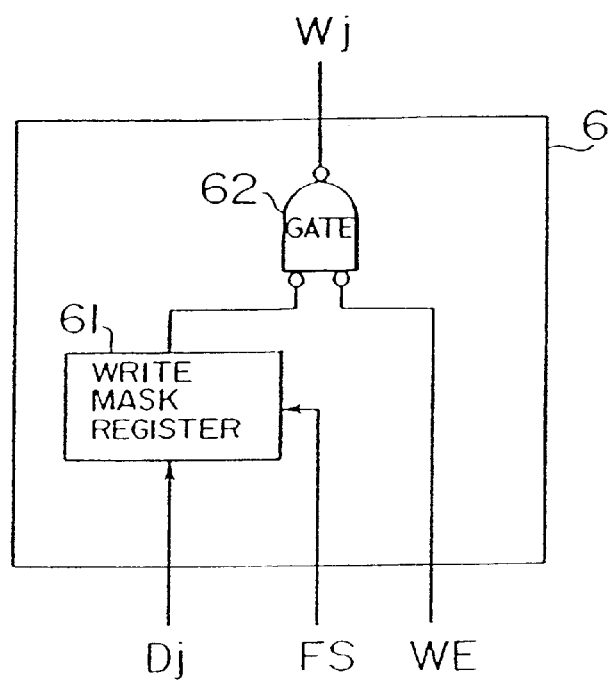
FIG. 34 is a schematic logic diagram showing the write mask circuit in FIG. 33.

FIG. 34 shows, as an example, the arrangement of the write mask register, which includes a write mask data register 61 and a gate 62 for disabling the write control signal WE.

Figure 35:
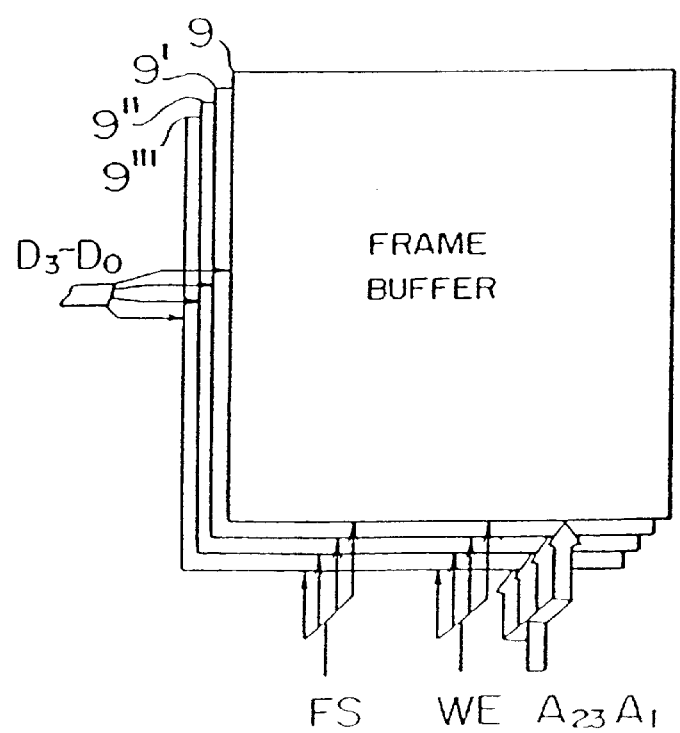
FIG. 35 is a diagram used to explain the frame buffer constructed using the memory circuit shown in FIG. 33.

FIG. 35 shows the arrangement of the frame buffer constructed by using the memory circuit shown in FIG. 33. The figure shows a 4-bit arrangement for clarifying the connection to each memory circuit.

Figure 36:
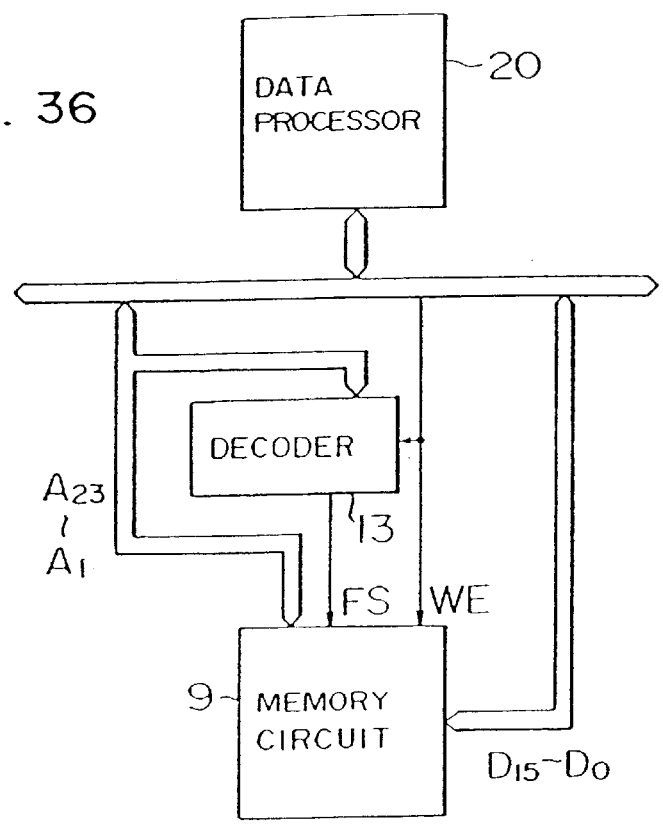
FIG. 36 is a block diagram showing the arrangement of the graphic display system for explaining operation code setting according to this embodiment.

FIG. 36 shows the memory circuit of this embodiment applied to a graphic display system, with the intention of explaining the setting of the operation code. Reference number 20 denotes a data processor, and 23 denotes a decoder for producing the set signal FS.

The following describes the operation of the memory circuit. In this embodiment, an address range 800000H–9FFFFFH is assigned to the memory circuit 9. The decoder 23 produces the set signal FS in response to addresses A00000H–A0001FH. The operation unit 1 has the 16 operational functions as listed in FIG. 31.

When the data processor 20 operates to write data F0FFH in address A00014H, for example, the decoder 23 produces the set signal FS to load the address bit signals A4–A1, i.e., 0101B (B signifies binary), in the operational function specifying register 3. Consequently, the operation unit 2 selects the logical-sum operation in compliance with the table in FIG. 31. In the write mask register 26, a bit of 16-bit data 0F00H from the data processor 20, the bit position being the same as the bit position of the memory device, is set in the write mask data register 61. As a result, F0FFH is set as write mask data.

Figure 37:
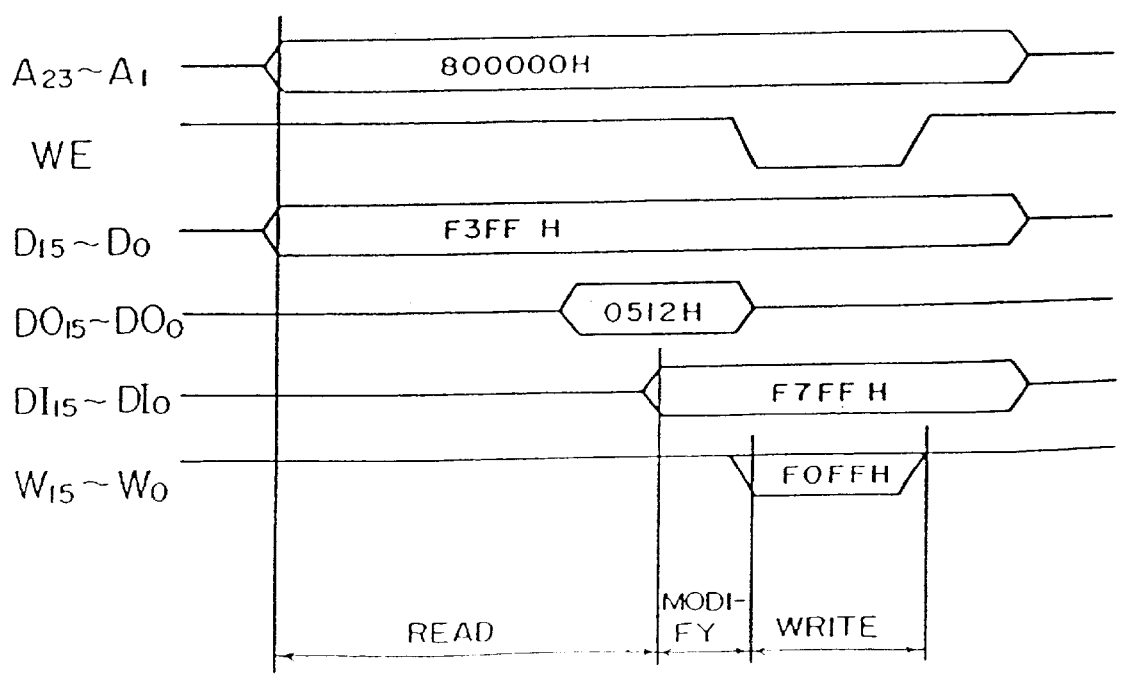
FIG. 37 is a timing chart showing the memory access timing relationship according to this embodiment.

Next, the operation of the data processor 20 for writing F3FFH in address 800000H will be described. It is assumed that the address B00000H has the contents of 0512H in advance. FIG. 37 shows the timing relation-ship of memory access by the data processor 10. The write access to the memory circuit 9 by the data processor 20 is the read-modify-write operation as shown in FIG. 37. In the read period of this operation, data 0512H is read out onto the DO bus, and the D bus. receives F3FFH. In the subsequent modification period, the operation unit 1 implements the operation between data on the D bus and DO bus and outputs the operation result onto the DI bus. In this example, the D bus carries F3FFH and the DO bus carries 0512H, and the DI bus will have data F7FFH as a result of the logical-sum operation which has been selected for the operation unit 1. Finally, in the write period of the read-modify-write operation, data F7FFH on the DI bus is written in the memory device. In this case, F0FFH has been set as write mask data by the aforementioned setting operation, and a "0" bit of mask data enables the gate 62, while "1" bit disables the gate 62 as shown in FIG. 34, causing only 4 bits (D11–D8) to undergo the actual write operation, with the remaining 12 bits being left out of the write operation. Consequently, data in address 800000H is altered to 0712H.

The foregoing embodiment of this invention provides the following effectiveness. Owing to the provision of the operation specifying registers 23 and 24 and the write mask registers 26 and 27 in correspondence to the data processors 20 and 20', specification of a modification function for the read-modify-write operation and mask write specification are done for each data processor even in the case of write access to the frame buffer memory 9 by the data processors 20 and 20' asynchronously and independently, which eliminates the need for arbitration control between the data processors, whereby both processors can implement display processings without interference from each other except for an access delay caused by conflicting accesses to the frame buffer memory 9.

The above embodiment is a frame buffer memory for a graphic display system, and the data processors 20 and 20' mainly perform the coordinate calculations for pixels. The two data processors can share in the coordinate calculation and other processes in case they consume too much time, thereby reducing the processing time and thus minimizing the display wait time. For the case of a time-consuming frame buffer write processing, the use of the read-modify-write operation reduces the frequency of memory access, whereby a high-speed graphic display system operative with a minimal display wait time can be realized.

The above embodiment uses part of the address signal for the control signal, and in consequence a memory-circuit operative in read-modify-write mode with the ability of specifying the operational function independent of data slicing methods can be realized. On this account, when all functional blocks are integrated in a circuit component, the arrangement of the memory section can be determined independently of the read-modify-write function.

Figure 38:
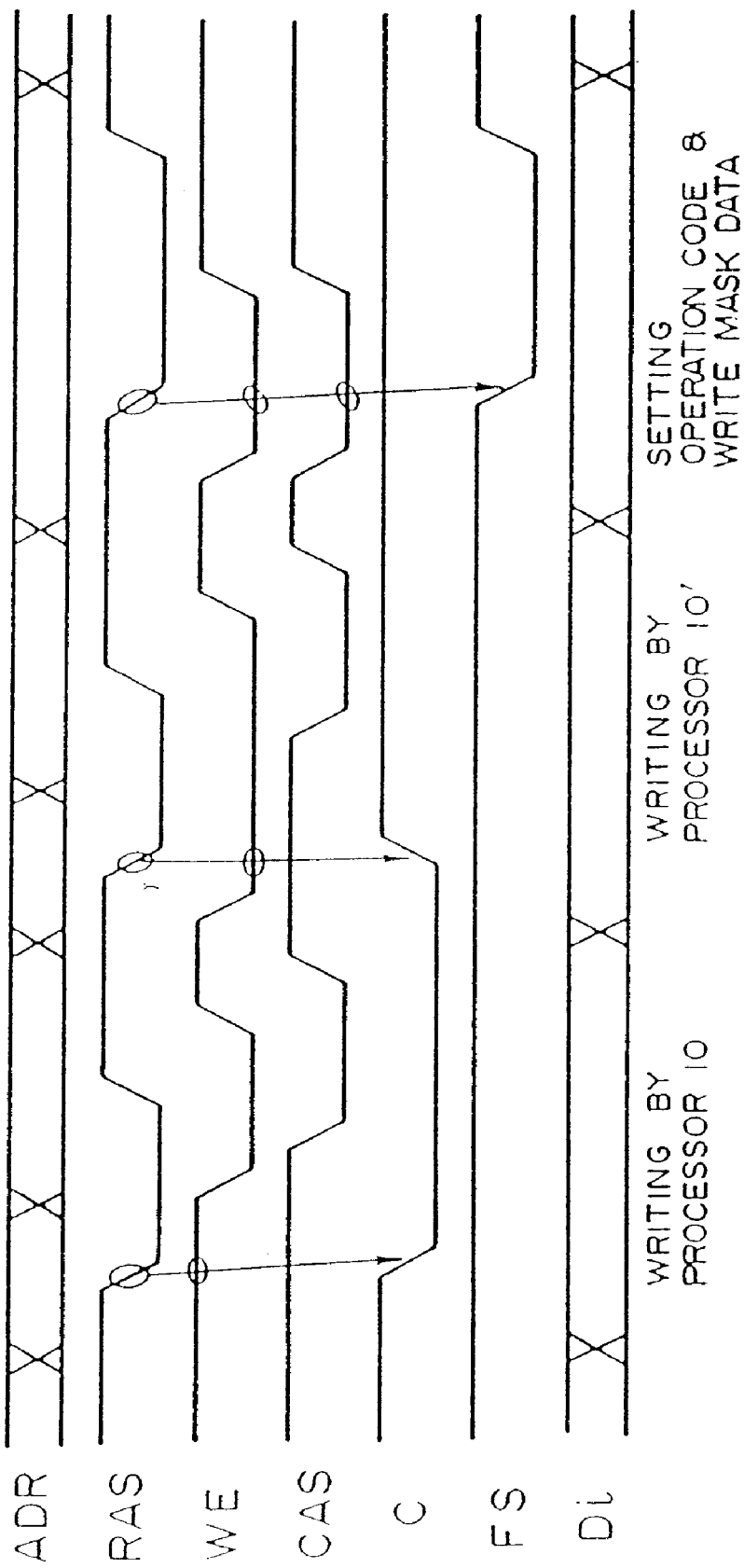
FIG. 38 is a timing chart showing the generation of the selection signal and operation code setting signal based on the memory access timing relationship.

Although in the foregoing embodiment two data processors are used, it is needless to say that a system including three or more data processors can be constructed in the same principle. The present invention is obviously applicable to a system in which a single data processor initiates several tasks and separate addresses are assigned to the individual tasks for implementing parallel display processings. The memory circuit of the above embodiment differs from the usual memory IC component in that the set signal FS for setting the operational function and w-rite-mask data and the signal C for selecting an operational function and write mask are involved. These signals may be provided from outside at the expense of two additional IC pins as compared with the usual memory device, or may be substituted by the aforementioned signals by utilization of the memory access timing relationship for the purpose of minimizing the package size. FIG. 38 shows the memory access timing relationship for the latter method, in which a timing unused in the operation of a usual dynamic RAM is used to distinguish processors (the falling edge of RAS causes the WE signal to go low) and to set the operation code and write mask data (the rising edge of RAS causes CAS and WE signals to go low), thereby producing the FS and C signals equivalently. Although in the above embodiment a 16-bit data word is sliced into 1-bit groups, these values can obviously be altered. Although in the above embodiment the operational function and write mask are specified concurrently, they may be specified separately.

It is obvious that the word length for operational function specification may be other than 4 bits. The above embodiment can also be applied to a memory with a serial output port by incorporating a shift register. According to the above embodiments, the coordinate calculation process in the display process is shared by a plurality of processors so that the calculation time is reduced, and the frame buffer memory operative in a read-modify-write mode can be shared among the processors without the need of arbitration control so that the number of memory accesses is reduced, whereby a high-speed graphic display system can be constructed. Moreover, the modification operation for the read-modify-write operation is specified independently of the word length of write data, and this realizes a memory circuit incorporating a circuit which implements the read-modify-write operation in arbitrary word lengths, whereby a frame buffer used in a high-speed graphic display system, for example, can be made compact.

What is claimed is:

1. A one chip memory device comprising:

a memory element; and a control unit including:

a first external terminal for inputting data;

a second external terminal for inputting an indication signal indicating a mode of writing logic level generated in said one chip memory device into said memory element;

a selection means for selecting a mode among a plurality of modes based on said indication signal inputted from said second terminal; and an executing means for executing a write operation to said memory element under said mode selected by said selection means, wherein said executing means continues said write operation under said selected mode until a time of inputting an indicating signal which indicates a mode different from said selected mode.

2. A one chip memory device according to claim 1, wherein said indicating signal is made of a plurality of bits.

3. A one chip memory device comprising:

a plurality of memory elements; and a control unit including:

a first external terminal for inputting data;

a second external terminal for inputting an indication signal indicating a mode of writing data from said first external terminal into said plurality of memory elements, a selection means for selecting a mode among a plurality of modes based on said indication signal inputted from said second terminal; and an executing means for executing a write operation to said plurality of memory elements under said mode selected by said selection means, wherein said executing means continues said write operation under said selected mode until a time of inputting an indicating signal which indicates a mode different from said selected mode.

4. A one chip memory device according to claim 3, wherein said indicating signal is made of a plurality of bits.

* * * * *